US012566330B2

(12) United States Patent
Lee et al.

(10) Patent No.: US 12,566,330 B2
(45) Date of Patent: Mar. 3, 2026

(54) HEAD MOUNT DISPLAY DEVICE

(71) Applicant: Samsung Display Co., LTD., Yongin-si (KR)

(72) Inventors: Cheon Myeong Lee, Seoul (KR); Sang-Ho Kim, Gwangmyeong-si (KR); Jun Hyeong Park, Seoul (KR); Soo Min Baek, Hwaseong-si (KR); Ju Youn Son, Cheonan-si (KR); Ji Won Lee, Suwon-si (KR); Ju Hwa Ha, Jung-gu (KR); Jong Ho Hong, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 749 days.

(21) Appl. No.: 17/885,546

(22) Filed: Aug. 11, 2022

(65) Prior Publication Data

US 2023/0129724 A1     Apr. 27, 2023

(30) Foreign Application Priority Data

Oct. 22, 2021    (KR) ........................ 10-2021-0141621

(51) Int. Cl.
*G02B 5/30*          (2006.01)
*G02B 27/01*         (2006.01)
(Continued)

(52) U.S. Cl.
CPC ....... *G02B 27/0172* (2013.01); *G02B 5/3083* (2013.01); *G02B 27/144* (2013.01);
(Continued)

(58) Field of Classification Search
CPC .......................... G02B 27/0172; G02B 5/3083; G02B 27/144; G02B 27/283; G02B 5/3033;
(Continued)

(56) References Cited

U.S. PATENT DOCUMENTS

| | | |
|---|---|---|
| 8,125,143 B2 | 2/2012 | Park et al. |
| 10,642,112 B2 | 5/2020 | Im et al. |

(Continued)

FOREIGN PATENT DOCUMENTS

| | | |
|---|---|---|
| KR | 1020160086486 | 7/2016 |
| KR | 20200058987 A | 5/2020 |

*Primary Examiner* — Bumsuk Won
*Assistant Examiner* — John Curtis Sipes
(74) *Attorney, Agent, or Firm* — CANTOR COLBURN LLP

(57) ABSTRACT

A head mount display device, includes: a display panel; and an optical system positioned in front of the display panel. The display panel sequentially includes a light emitting element part, a third retarder, a reflective polarizer, and an absorptive polarizer, where the third retarder is positioned in front of the light emitting element part; and the optical system includes: a first curved lens, which is positioned to face the display panel, and includes a first retarder positioned on a first surface facing the display panel and a beam splitter positioned on a second surface thereof opposite to the first surface; and a second curved lens, which is positioned to face the beam splitter, and includes a second retarder positioned a first surface thereof facing the beam splitter and a second reflective polarizer positioned on a second surface thereof opposite to the first surface of the second curved lens.

20 Claims, 18 Drawing Sheets

(51) Int. Cl.
　　*G02B 27/14*　　　　(2006.01)
　　*G02B 27/28*　　　　(2006.01)
　　H10K 50/86　　　(2023.01)
　　*H10K 59/122*　　　(2023.01)

(52) U.S. Cl.
　　CPC ......... *G02B 27/283* (2013.01); *H10K 50/865*
　　　　　　(2023.02); *H10K 59/122* (2023.02)

(58) Field of Classification Search
　　CPC .... G02B 5/3066; G02B 27/10; H10K 50/865;
　　　　　　H10K 59/122; H10K 85/141; H10K
　　　　　　85/20; H10K 85/221; H10K 85/615;
　　　　　　H10K 85/6572; H10K 85/761; H10K
　　　　　　59/879; H10K 59/8791; H10K 50/858;
　　　　　　H10K 50/841; H10K 50/856
　　See application file for complete search history.

(56) References Cited

U.S. PATENT DOCUMENTS

| | | | | |
|---|---|---|---|---|
| 10,838,208 | B2 * | 11/2020 | Ouderkirk | .......... G02B 17/0804 |
| 11,500,211 | B2 * | 11/2022 | Komura | ............. G02B 27/0172 |
| 2003/0089956 | A1 * | 5/2003 | Allen | ................... G02B 27/281 |
| | | | | 257/432 |
| 2003/0181694 | A1 * | 9/2003 | Shirane | ................. H10K 50/11 |
| | | | | 435/6.12 |
| 2004/0051827 | A1 * | 3/2004 | Hinata | ................ H04M 1/0266 |
| | | | | 349/113 |
| 2011/0273643 | A1 | 11/2011 | Arai et al. | |
| 2012/0133871 | A1 * | 5/2012 | Saigusa | ................ G02B 5/3083 |
| | | | | 349/193 |
| 2014/0340728 | A1 * | 11/2014 | Taheri | .............. G02F 1/133528 |
| | | | | 359/250 |
| 2016/0070030 | A1 * | 3/2016 | Fujisawa | ................... G02B 1/08 |
| | | | | 252/585 |
| 2017/0084867 | A1 * | 3/2017 | Lim | ...................... H10K 59/879 |
| 2019/0227378 | A1 * | 7/2019 | Watanabe | ......... G02F 1/133533 |
| 2019/0285902 | A1 * | 9/2019 | Ouderkirk | .......... G02B 27/0955 |
| 2019/0369390 | A1 * | 12/2019 | Gollier | ............... G02B 27/0172 |
| 2019/0377176 | A1 | 12/2019 | Sharp | |
| 2019/0384070 | A1 | 12/2019 | Geng et al. | |
| 2020/0161592 | A1 | 5/2020 | Shin et al. | |
| 2020/0209657 | A1 * | 7/2020 | Weindorf | ............ G02F 1/13475 |
| 2020/0284963 | A1 * | 9/2020 | Yun | ....................... G02B 5/3083 |
| 2020/0379226 | A1 * | 12/2020 | Steiner | ................. G02B 5/3083 |
| 2021/0036264 | A1 | 2/2021 | Hu et al. | |
| 2022/0158141 | A1 * | 5/2022 | Yuki | .................... G02B 5/3083 |
| 2022/0199689 | A1 | 6/2022 | Huang | ................... H10K 50/82 |
| 2022/0322546 | A1 * | 10/2022 | Wang | .................... G06F 1/1652 |
| 2022/0334399 | A1 * | 10/2022 | Ronen | ................. G02B 6/4298 |
| 2022/0382102 | A1 * | 12/2022 | Zhong | ................. C09K 19/601 |
| 2023/0165108 | A1 * | 5/2023 | Xu | ........................ H10K 77/111 |
| | | | | 257/40 |
| 2023/0273452 | A1 * | 8/2023 | Yamada | ................. G03B 35/26 |
| | | | | 345/173 |

* cited by examiner

300

222 — Reflective Polarizer(Reflective axis = 0°)

221 — Retarder (λ/4)

212 — Beam Splitter(50:50)

200

4 RCP 75 %

5 LCP 37.5 %

211 — Retarder(λ/4)

3 Linear(90°) 75 %

6 Linear(0°) 37.5 %

Loss due to light absorption

110 — Absorptive Polarizer(Absorptive axis = 0°)

120 — Reflective Polarizer(Reflective axis = 0°)

2 non-Pol 100 %

130 — Retarder(λ/4)

1 non-Pol 100 %

100

150 — Cathode

DNA-biscyanine assemblies

Circularly polarized luminescence (CPL)

CPL-active DNA origami

HEAD MOUNT DISPLAY DEVICE

This application claims priority to Korean Patent Application No. 10-2021-0141621, filed on Oct. 22, 2021, and all the benefits accruing therefrom under 35 U.S.C. § 119, the content of which in its entirety is herein incorporated by reference.

BACKGROUND

1. Field

The present disclosure relates to a head mount display device, and more particularly, to a head mount display device that may improve light efficiency.

2. Description of the Related Art

A light emitting display device is a self-luminous display device and displays an image by emitting light from a light emitting diode.

Such a light emitting display device is included and used in various electronic devices, and in order to provide a three-dimensional or immersive feeling to a user, a head mount display device directly positioned in front of the user's eyes and displaying an image is also widely available.

As a polarizer is used in the head mount display device, light efficiency of the display device is decreased.

SUMMARY

Embodiments are to provide a head mount display device with improved light efficiency.

An embodiment provides a head mount display device, including: a display panel; and an optical system positioned in front of the display panel. The display panel includes layers arranged in an order of a light emitting element part, a third retarder, a reflective polarizer, and an absorptive polarizer. The third retarder is positioned between the optical system and the light emitting element part. The optical system includes: a first curved lens, which is positioned to face the display panel, and includes a first retarder positioned on a first surface thereof facing the display panel and a beam splitter positioned on a second surface thereof opposite to the first surface; and a second curved lens, which is positioned to face the beam splitter, and includes a second retarder positioned on a first surface thereof facing the beam splitter and a second reflective polarizer positioned on a second surface thereof opposite to the first surface of the second curved lens.

The first reflective polarizer of the display panel may have a first reflective axis, may reflect polarized light of the first reflective axis, and may transmit polarized light perpendicular to the first reflective axis; and the absorptive polarizer of the display panel may have an absorptive axis, may absorb polarized light of the absorptive axis, and may transmit polarized light perpendicular to the absorptive axis.

The third retarder may have a first retardation axis, and may retard light in a direction of the first retardation axis by $\lambda/4$ to change linearly polarized light to circularly polarized light or change circularly polarized light to linearly polarized light.

The absorptive axis and the first reflective axis may have the same direction.

The second reflective polarizer of the second curved lens may have a second reflective axis, may reflect polarized light of the second reflective axis, and may transmit polarized light perpendicular to the second reflective axis.

The first retarder of the first curved lens may have a second retardation axis, and may retard light in a direction of the second retardation axis by $\lambda/4$ to change linearly polarized light to circularly polarized light or change circularly polarized light to linearly polarized light; and the second retarder of the second curved lens may have a third retardation axis, and may retard light in a direction of the third retardation axis by $\lambda/4$ to change linearly polarized light to circularly polarized light or change circularly polarized light to linearly polarized light.

The second reflective axis may have the same angle as each of the absorptive axis and the first reflective axis.

The first reflective axis, the second retardation axis, and the third retardation axis may have an angle of 45 degrees to the absorptive axis and the first reflective axis.

At least one of the third retarder of the display panel, the first retarder of the first curved lens, and the second retarder of the second curved lens may have an inverse wavelength dispersion characteristic.

The beam splitter of the first curved lens may reflect half of incident light, and may transmit the other half of the incident light.

The light emitting element part may include an anode, an intermediate layer including a light emitting layer, and a cathode; and the cathode may reflect half of light incident from a front surface thereof.

The display panel may further include an encapsulation substrate, which blocks moisture or air from flowing into the light emitting layer; and the encapsulation substrate may be positioned at an upper portion of the cathode.

The encapsulation substrate may be in contact with at least one of the third retarder, the first reflective polarizer, and the absorptive polarizer.

The display panel may further include an encapsulation layer, which blocks moisture or air from flowing into the light emitting layer; and the encapsulation layer may include a first encapsulation inorganic layer and a second encapsulation inorganic layer, which are two inorganic encapsulation layers, and an encapsulation organic layer, which is one organic encapsulation layer; and the first encapsulation inorganic layer, the encapsulation organic layer, and the second encapsulation inorganic layer may be sequentially stacked.

Another embodiment provides a head mount display device, including: a display panel; and an optical system positioned in front of the display panel. The display panel includes a light emitting element part, which emits circularly polarized light; and the optical system includes a curved lens, which includes a retarder positioned on a first surface thereof facing the display panel and a reflective polarizer positioned on a second surface thereof opposite to the first surface.

A separate optical film may not be positioned between the light emitting element part of the display panel and the optical system.

The retarder may have a retardation axis, and may retard light in a direction of the retardation axis by $\lambda/4$ to change linearly polarized light to circularly polarized light or change circularly polarized light to linearly polarized light.

The reflective polarizer may reflect polarized light of a reflective axis, and may transmit polarized light perpendicular to the reflective axis.

The retardation axis and the reflective axis may form an angle of 45 degrees.

A light emitting layer of a light emitting diode included in the light emitting element part may include a material of chiral luminophore or a material of a helix structure, or may emit circularly polarized light through a birefringence method.

According to the embodiments, while using a pancake lens in an optical system, it is possible to improve light efficiency of a head mount display device by using a reflective polarizer in the optical system and display panel. In addition, ghost images are reduced in a head mount display device, thereby improving display quality.

BRIEF DESCRIPTION OF THE DRAWINGS

FIG. 6 illustrates a light path of a ghost image in the head mount display device according to the embodiment of FIG. 4.

FIG. 7 illustrates a detailed cross-sectional view of a display panel for a head mount display device according to an embodiment.

FIG. 9 illustrates a detailed cross-sectional view of a display panel for a head mount display device according to another embodiment.

FIG. 10 illustrates a light path and transmittance of a head mount display device according to another embodiment.

FIG. 13 and FIGS. 14A to 14E illustrate in detail an example of a light emitting layer of the display panel for the head mount display device according to the embodiment of FIG. 11.

DETAILED DESCRIPTION

Figure 1:
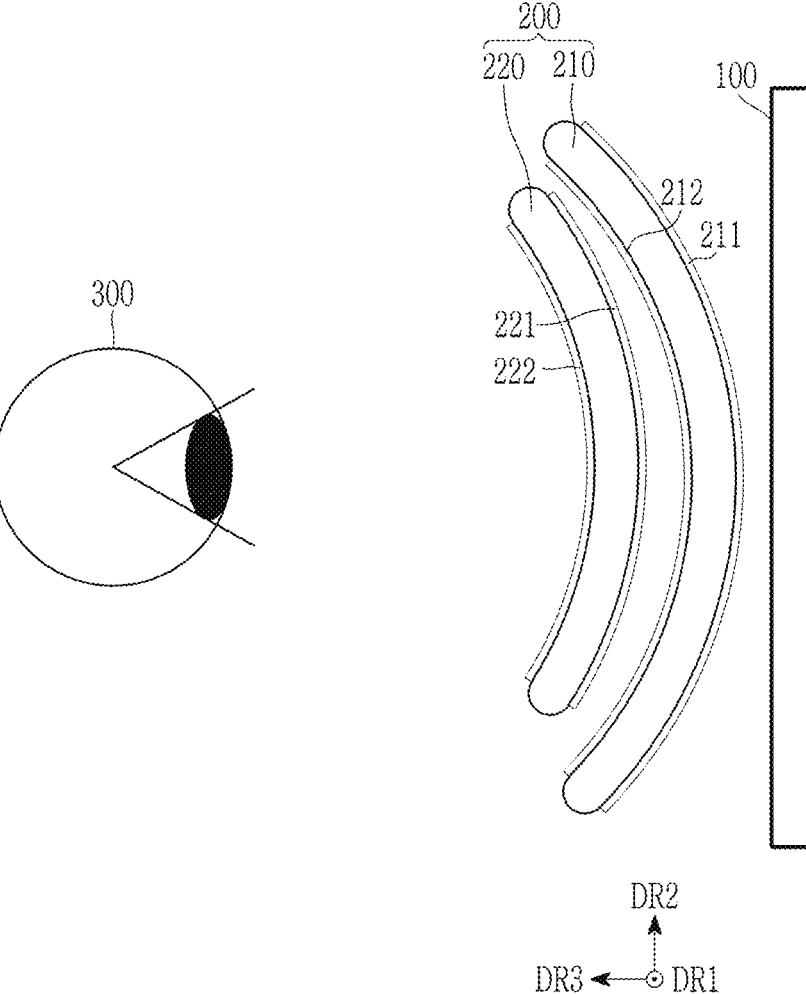
FIG. 1 illustrates a schematic cross-sectional view of a head mount display device according to an embodiment.

The present invention will be described more fully hereinafter with reference to the accompanying drawings, in which embodiments of the invention are shown. As those skilled in the art would realize, the described embodiments may be modified in various different ways, all without departing from the spirit or scope of the present invention.

In order to clearly describe the present invention, parts or portions that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas, etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

Hereinafter, a head mount display device according to an embodiment will be described with reference to FIG. 1.

FIG. 1 illustrates a schematic cross-sectional view of a head mount display device according to an embodiment.

The head mount display device according to the embodiment mainly includes a display panel 100 (hereinafter also referred to as a display panel for a head mount display device) and an optical system 200 positioned in front of the display panel 100. Here, the optical system 200 may be positioned between the display panel 100 and a user's eye 300 to allow light emitted from the display panel 100 to be viewed wider to the user's eye 300, thereby improving immersion and three-dimensional effects. As used herein, both "front" and an "upper" direction means a direction toward the user's eye 300 in the figures, that is, a third direction DR3.

The optical system 200 includes two curved lenses 210 and 220 (hereinafter referred to as pancake lenses), and optical films 211, 212, 221, and 222 are disposed on opposite surfaces of the curved lenses 210 and 220, respectively. The first curved lens 210 (hereinafter also referred to as a first pancake lens) is located to face the display panel 100, and the second curved lens 220 (hereinafter also referred to as a second pancake lens) is positioned adjacent to the user's eye 300.

Hereinafter, the optical system 200 will be described in detail.

A first retarder 211 (hereinafter also referred to as a first optical system retarder) is disposed at a first side (hereinafter also referred to as an inner side as a direction opposite to a third direction DR3) of the first curved lens 210 positioned adjacent to the display panel 100 (i.e., facing the display panel 100), and a beam splitter 212 is disposed at a second side of the first curved lens 210 opposite to the first side (i.e., first surface) (hereinafter also referred to as an outside as a third direction DR3). The first side of the first curved lens 210 may be convex toward the display panel 100, and the second side of the first curved lens 210 may be concave toward the display panel 100.

The first retarder 211 may also be referred to as a λ/4 plate, and it may change linear polarization to circular polarization or change circular polarization to linear polarization by providing a phase difference of λ/4 with respect to a retardation axis. The beam splitter 212 transmits half of incident light, reflects half of the incident light, and reflects and transmits light regardless of a polarization characteristic of the light.

The second retarder 221 (hereinafter also referred to as second optical retarder) is disposed at an inner side (in an opposite direction of the third direction DR3) of the second curved lens 220, that is, faces the beam splitter 212, and the reflective polarizer 222 (hereinafter also referred to as an optical system reflective polarizer) is disposed at an outer side (the third direction DR3), that is, faces the user's eye 300. The inner side of the second curved lens 220 may be convex toward the display panel 100, and the outer side of the second curved lens 220 may be concave toward the display panel 100.

The second retarder 221 may also be referred to as a λ/4 plate, and it may change linear polarization to circular polarization or change circular polarization to linear polarization by providing a phase difference of λ/4 with respect to a retardation axis. The reflective polarizer 222 has a reflective axis, reflects linear polarization of a direction of the reflective axis, and transmits linear polarization of a direction perpendicular to the reflective axis. The reflective polarizer 222 may have a wire grid structure in which a plurality of metal lines having a fine width are arranged in one direction, and may reflect light parallel to an arrangement direction of the metal lines and transmit light perpendicular to the arrangement direction. In this case, a distance between the plurality of metal lines may be narrower than a wavelength of visible light.

The first curved lens 210 and the second curved lens 220 included in the optical system 200 may be made of an optically isotropic material, and for example, they may be made of glass or polymethyl methacrylate ("PMMA"). In addition, curved surfaces of the first curved lens 210 and the second curved lens 220 may be spherical or aspherical.

Hereinafter, a display panel for a head mount display device according to an embodiment will be described with reference to FIG. 2.

Figure 2:
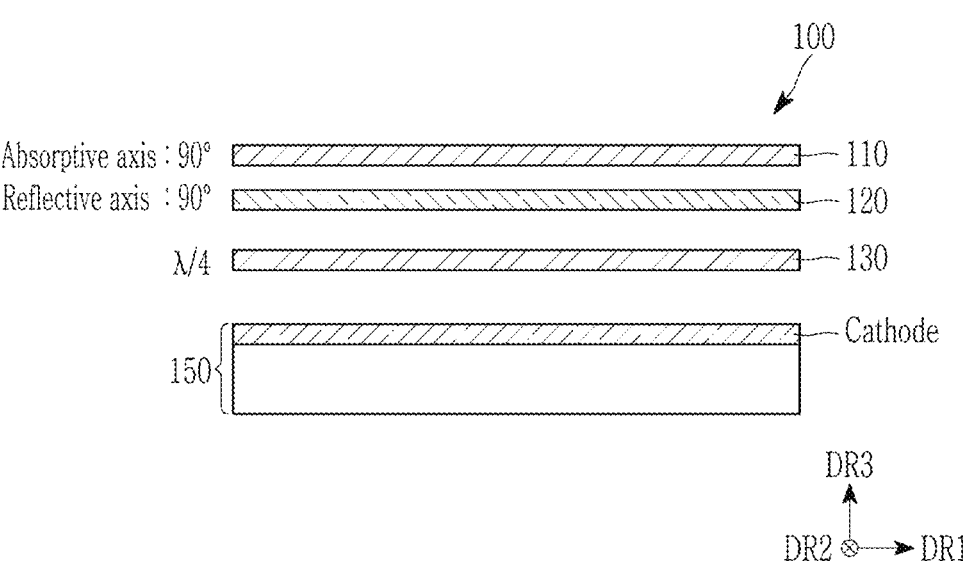
FIG. 2 illustrates a schematic cross-sectional view of a display panel for a head mount display device according to an embodiment.

FIG. 2 illustrates a schematic cross-sectional view of a display panel for a head mount display device according to an embodiment.

The display panel 100 used in the head mount display device according to an embodiment may be a self-luminous display panel that emits light by itself. Here, an example of the self-luminous display panel may include one of a micro LED, an organic light emitting element ("OLED"), and an inorganic light emitting diode ("LED"). An embodiment using the organic light emitting display panel will now be mainly described. FIG. 2 schematically illustrates a light emitting element part 150 included in the display panel 100, and the light emitting element part 150 may mean a plurality of layers included in the display panel 100 in which an organic light emitting element and a transistor connected thereto are formed. A cathode (Cathode) of the light emitting diode is positioned at an uppermost portion of the light emitting element part 150, FIG. 2 and the like illustrate only the cathode (Cathode), and a detailed cross-sectional structure thereof will be described in FIG. 7 and the like.

An absorptive polarizer 110 (hereafter referred to as an absorptive polarizer for a display panel), a reflective polarizer 120 (hereafter also referred to as a reflective polarizer for a display panel), and a retarder 130 (hereinafter also referred to as a retarder for a display panel) are disposed on a front surface (in the third direction DR3) of the light emitting element part 150. The absorptive polarizer 110 may be positioned at the outermost side (in the third direction DR3) of the light emitting element part 150, and the reflective polarizer 120 and the retarder 130 may be positioned at the inside of the light emitting element part 150.

The absorptive polarizer 110 has an absorptive axis, absorbs and does not transmit light of linear polarization of the absorptive axis, and transmits light of linear polarization perpendicular to the absorptive axis. Here, the direction perpendicular to the absorptive axis corresponds to a transmissive axis. The absorptive polarizer 110 may have a film form including tri-acetyl cellulose ("TAC").

The reflective polarizer 120 has a reflective axis, reflects light of linear polarization of the reflective axis, and transmits light of linear polarization perpendicular to the reflective axis. Here, the direction perpendicular to the reflective axis corresponds to a transmissive axis. Like the reflective polarizer 222, the reflective polarizer 120 have a wire grid structure in which a plurality of metal lines having a fine width are arranged in one direction, and may reflect light parallel to an arrangement direction of the metal lines and transmit light perpendicular to the arrangement direction. In this case, a distance between the plurality of metal lines may be narrower than a wavelength of visible light.

The retarder 130 may also be referred to as a λ/4 plate, and it may change linear polarization to circular polarization or change circular polarization to linear polarization by providing a phase difference of λ/4 with respect to a retardation axis.

Figure 3:
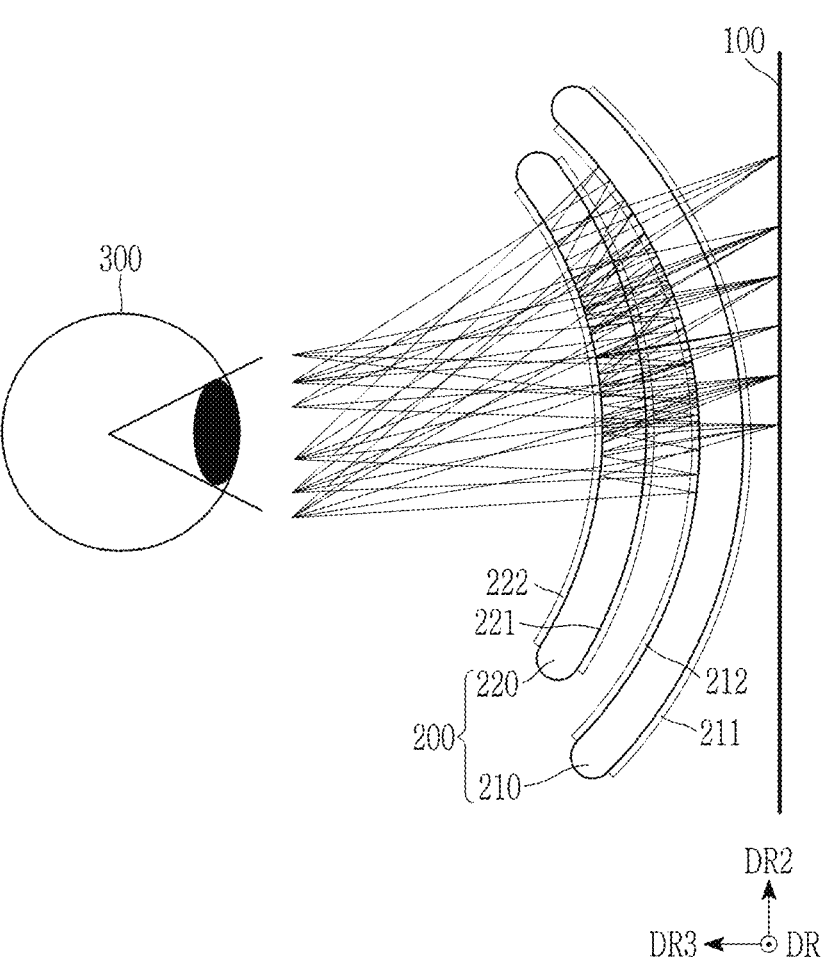
FIG. 3 illustrates a schematic light path of a head mount display device according to an embodiment.

A light path in the head mount display device having the above-described configuration may be as shown in FIG. 3.

FIG. 3 illustrates a schematic light path of a head mount display device according to an embodiment.

FIG. 3 schematically illustrates a light path through which light emitted from the display panel 100 for the head mount display device is transmitted to the user's eye 300 through the optical system 200.

Some of the light emitted from the display panel 100 for the head mount display device may pass through the first curved lens 210 and the second curved lens 220, respectively, and may be provided to the user's eye 300. In addition, some of the light may be provided to the user's eye 300 after being reflected by the reflective polarizer 222 of the second curved lens 220 and then after being reflected by the beam splitter 212 of the first curved lens 210. The reflection by the reflective polarizer 222 and the beam splitter 212 may occur several times, and the reflected light may then be provided to the user's eye 300.

Referring to FIG. 3, since the user's eye 300 recognizes the light reflected by the first curved lens 210 and the second curved lens 220, the user sees an image larger than a size of the display panel 100 for the head mount display device. As a result, a degree to which the user is immersed in the image is large, and three-dimensional sensitivity felt during three-dimensional display may be improved. In addition, when the two curved lenses 210 and 220 are used, as shown in FIG. 3, the light path becomes longer, so that even with a thin head mount display device, it is possible to make the same effect as if an image is being presented from a longer distance than the actual distance from the thin head mount display device.

Characteristics and transmittance of light in the head mount display device according to the embodiment described above will be described in detail with reference to FIG. 4.

Figure 4:
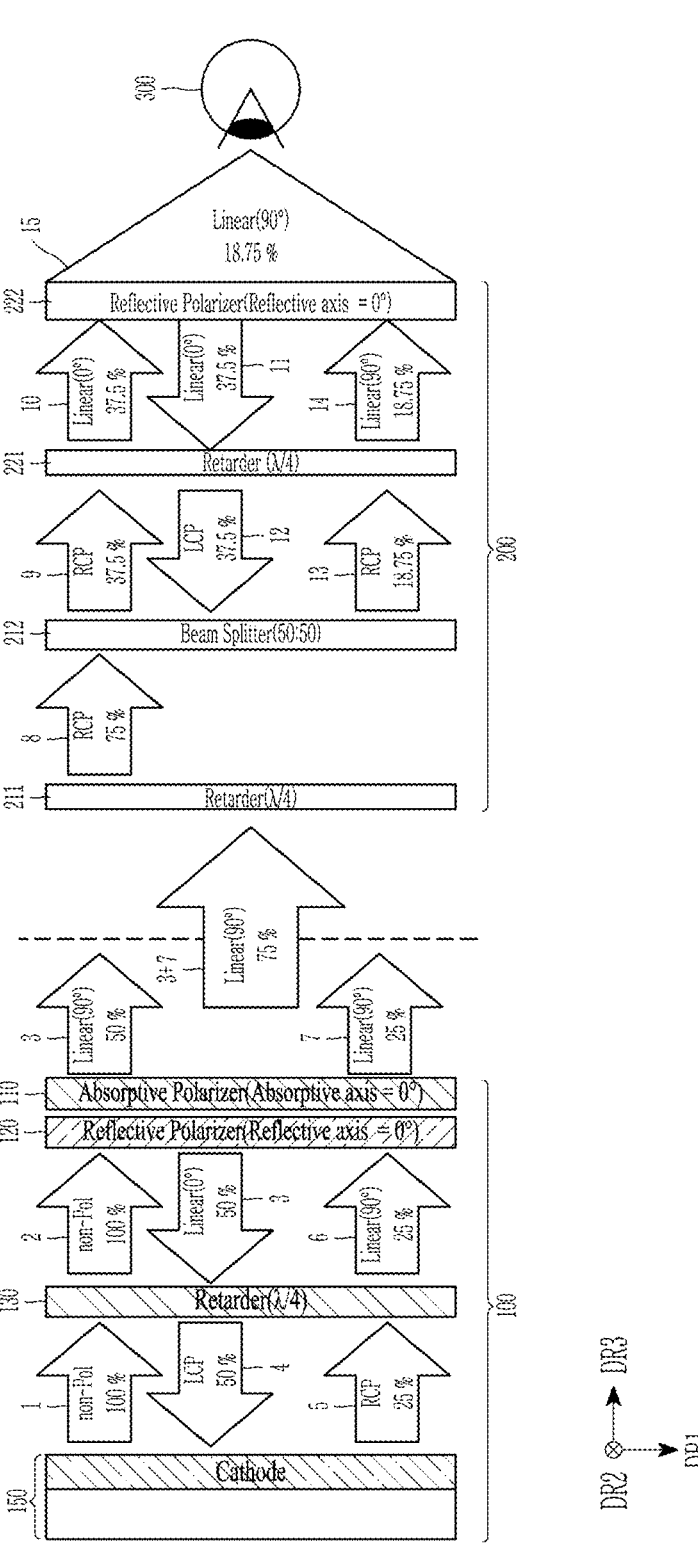
FIG. 4 illustrates a light path and transmittance of a head mount display device according to an embodiment.

FIG. 4 illustrates a light path and transmittance of a head mount display device according to an embodiment.

Although each layer is illustrated as having a planar structure in FIG. 4, an actual structure thereof corresponds to that of FIG. 1, so that although the optical system 200 has a curved surface, it is simply illustrated as a flat surface for convenience.

In FIG. 4, transmittance along with a light path and a polarization characteristic in the display panel 100 for the head mount display device will now be described.

In the display panel 100 for the head mount display device according to the embodiment of FIG. 4, only the cathode (Cathode) of the light emitting diode is shown at an uppermost side of the light emitting element part 150, and the retarder 130, the reflective polarizer 120, and the absorptive polarizer 110 are sequentially positioned at an upper side from the cathode (Cathode) to the third direction DR3.

The reflective polarizer 120 and the absorptive polarizer 110 are arranged at 0° with respect to the reflective axis and the absorptive axis, respectively, and a retardation axis of the retarder 130 may be arranged at about 45° with respect to the reflective axis and absorptive axis of the reflective polarizer 120 and absorptive polarizer 110.

Here, the cathode (Cathode) of the light emitting diode may have a transflective characteristic, and may reflect only about 50% of light when the light is reflected. However, in some embodiments, the reflectance of the cathode (Cathode) may be different from the example described above.

In FIG. 4, a number is assigned to each light, and the characteristic of the light will be described according to the order of the number. In FIG. 4, the light emitted from the display panel 100 for the head mount display device is described as the number 1 to number 7.

Referring to light of number 1, the light emitted from cathode (Cathode) of the light emitting diode in the third direction DR3 is referred to as 100%, that is, the light emitted from the cathode (Cathode) of the light emitting diode has a polarization characteristic in all directions. In FIG. 4, it is denoted as 'non-Pol' and shows that there is no polarized direction.

Then, referring to light of number 2, it transmits through the retarder 130, and since the light incident on the retarder 130 includes light in all directions, although a retardation of $\lambda/4$ is provided with respect to a retardation axis, the transmitted light has light in all directions. There may be no loss of the light in the number 2.

After that, when the light transmitting through the retarder 130 is incident on the reflective polarizer 120 and the absorptive polarizer 110, the reflective axis of the reflective polarizer 120 and the absorptive axis of the absorptive polarizer 110 are formed in the same direction (0°), so that the light in the reflective axis direction (0°) of the reflective polarizer 120 is reflected, and the light in a direction (90°) perpendicular thereto transmits through the reflective polarizer 120 and the absorptive polarizer 110. In FIG. 4, light of number 3 is shown as two, and the light of transmitting through the reflective polarizer 120 and the absorptive polarizer 110 is light of linear polarization (Linear) having a direction of 90°, and only half (50%) of the light incident on the reflective polarizer 120 and the absorptive polarizer 110 is transmitted. On the other hand, the light reflected on the reflective polarizer 120 is also half (50%) of the light incident on the reflective polarizer 120 and the absorptive polarizer 110, and is linear polarization light of 0°, which is the direction of the reflective axis.

After that, referring to light of number 4, when the light reflected on the reflective polarizer 120 is incident on the retarder 130, retardation is provided only for a retardation axis in a 45° direction, so that linear polarization (Linear) of 0° is changed to left-circularly polarized ("LCP") light, and all the 50% of the light is transmitted. In some embodiments, it may be changed to right-circularly polarized ("RCP") light, but in the present embodiment, it is set to be changed to left-circularly polarized light.

After that, referring to light of number 5, only 25% of the light (half of the light of number 4) is reflected while being partially reflected on the cathode (Cathode) of the light emitting diode (LED), and in this case, a phase thereof is changed 180 degrees, and it is reflected while changing to right-circularly polarized (RCP) light.

After that, referring to light of number 6, the right-circularly polarized (RCP) light, while passing through the retarder 130, is changed to linearly polarized light again, and in this case, it is changed to 90° linearly polarized light, and 25% of the incident light is transmitted as it is.

Then, referring to light of number 7, since the light incident on the reflective polarizer 120 and the absorptive polarizer 110 is 90° linearly polarized (Linear) light, it is perpendicular to the reflective axis (0°) and the absorptive axis (0°), so it is transmitted as it is, that is, all the light of number 6 passes. As a result, 25% of 90° linearly polarized (Linear) light of number 7 is transmitted.

In FIG. 4, the light transmitting through the reflective polarizer 120 and the absorptive polarizer 110 are shown as the light of number 3 and number 7, respectively, and when they are added, they become 75% of 90° linearly polarized (Linear) light. Accordingly, the light transmitted from the display panel 100 for the head mount display device to the optical system 200 is 75% of 90° linearly polarized (Linear) light. This light is perpendicular to the reflective axis of the reflective polarizer 120 and to the absorptive axis of the absorptive polarizer 110, and is light in the transmissive axis of the reflective polarizer 120 and the absorptive polarizer 110.

Hereinafter, a method in which 75% of light having the 90° linearly polarized (Linear) light provided from the display panel 100 for the head mount display device to the optical system 200 passes through the optical system 200 to be transmitted to the user's eye 300 will be described.

In the optical system 200 of the head mount display device of FIG. 4, the reflective axis of the reflective polarizer 222 is set to 0°. The retardation axes of the first retarder 211 and the second retarder 221 may be disposed at about 45° with respect to the reflective axis of the reflective polarizer 222, and may be disposed at about 45° with respect to the reflective axis of the reflective polarizer 120 and the absorptive axis of the absorptive polarizer 110.

Referring to light of number 8, 75% of the light having linear polarization (Linear) of 90° transmitted to the optical system 200 passes through the first retarder 211 and is changed to right-circularly polarized (RCP) light, so that 75% of the right-circularly polarized (RCP) light is transmitted.

Referring to light of number 9, since while 75% of the right-circularly polarized (RCP) light is incident on the beam splitter 212, only half of incident light thereof is transmitted, so 37.5% of the right-circularly polarized (RCP) light is transmitted in the third direction DR3. Meanwhile, the other 50% of the light incident from the beam splitter 212 is reflected, which will be described in FIG. 5.

Referring to light of number 10, the second retarder 221 changes the right-circularly polarized (RCP) light to 0° linearly polarized light, and 37.5% of the 0° linearly polarized light is transmitted to the reflective polarizer 222.

Referring to light of number 11, since the reflective polarizer 222 has 0° as a reflective axis, all light of 0° is reflected and transmitted back to the second retarder 221, so that 37.5% of the light (number 11) having the linear polarization of 0° is incident again on the second retarder 221 in the direction opposite to the third direction DR3.

Referring to light of number 12, 37.5% of the 0° linearly polarized light, while passing through the second retarder 221, is changed to left-circularly polarized (LCP) light, so that 37.5% of the left-circularly polarized (LCP) light is incident back to the beam splitter 212.

Referring to light of number 13, as 37.5% of the left-circularly polarized (LCP) light is incident on the beam splitter 212, 18.75% of light, which is half of the incident light, is reflected, and the remaining 18.75% of the light is transmitted through the beam splitter 212. When reflected from the beam splitter 212, since a phase thereof is changed by 180 degrees, 18.75% of the right-circularly polarized (RCP) light (number 13) is transmitted back in the third direction DR3 to be incident on the second retarder 221. Here, the remaining 18.75% of light transmitted through the beam splitter 212 is related to a ghost image, and thus will be described in detail with reference to FIG. 6.

Referring to light of number 14, 18.75% of right-circularly polarized (RCP) light, while passing through the second retarder 221, is changed to 90° linearly polarized (Linear) light. Accordingly, 18.75% of the 90° linearly polarized (Linear) light is transmitted to the reflective polarizer 222.

Referring to light of number 15, since the reflective polarizer 222 has 0° as a reflective axis and 90° perpendicular to the reflective axis as a transmissive axis, all incident linearly polarized (Linear) light of 90° is transmitted. Accordingly, 18.75% of the light passes through the optical system 200 to be transmitted to the user's eye 300.

Generally, since a conventional head mount display including a polarizer has light efficiency of about 12.5%, there is a difference in light efficiency of about 6.25% compared with the present embodiment. The difference in light efficiency of 6.25% amounts to a 50% increase in light efficiency based on 12.5%, which is a very large difference in light efficiency, and thus a brighter image can be displayed with less current, and when the head mount display uses a battery, a time it can operate with a fully charged battery may be greatly increased.

Hereinafter, a case in which some light from the beam splitter 212 of the optical system 200 may be transmitted back to the display panel 100 for the head mount display device will be described with reference to FIG. 5 and FIG. 6.

In FIG. 4, the remaining light other than the light transmitted as the light of number 9 among the light incident on the beam splitter 212 of the light of number 8 is reflected and transmitted in a lower side direction (a direction opposite to the third direction DR3), and this light will now be described with reference to FIG. 5.

Figure 5:
FIG. 5 illustrates a light path that is lost in the head mount display device according to the embodiment of FIG. 4.

FIG. 5 illustrates a light path that is lost in the head mount display device according to the embodiment of FIG. 4.

Light of number 1 and light of number 2 in FIG. 5 correspond to the light of number 1 and the light of number 2 in FIG. 4, respectively, light of number 3 in FIG. 5 corresponds to light in which the light of number 3 and the light of number 7 in FIG. 4 are combined, and light of number 4 in FIG. 5 corresponds to the light of number 8 in FIG. 4.

The light of number 4 in FIG. 5 is light that 75% of light having linear polarization (Linear) of 90° transmitted to the optical system 200 is changed to right-circularly polarized (RCP) light as it passes through the first retarder 211 to be 75% of the right-circularly polarized (RCP) light.

Referring to light of number 5 in FIG. 5, 50% of light of which 75% of the right-circularly polarized (RCP) light is incident while passing through the beam splitter 212 is transmitted, but the remaining 50% is reflected, which is illustrated as the reflected light of number 5.

Since the phase of the light reflected from the beam splitter 212 is reversed by 180 degrees, an amount of light that is changed to the left circularly polarized (LCP) light is only half reflected, which is 37.5% of the light.

Thereafter, referring to light of number 6 in FIG. 5, the left-circularly polarized (LCP) light, while passing through the first retarder 211 again, is changed to 0° linearly polarized (Linear) light, and an amount of the light is maintained at 37.5%.

Thereafter, 37.5% of 0° linearly polarized (Linear) light is transmitted to the absorptive polarizer 110 positioned at an uppermost side of the display panel 100 for the head mount display device. Since the absorptive polarizer 110 has 0° as an absorptive axis, the 0° linearly polarized (Linear) light transmitted from the optical system 200 to the absorptive polarizer 110 is all absorbed and lost.

Accordingly, referring to FIG. 5, light of which incident light from the display panel 100 for the head mount display device is immediately reflected from the beam splitter 212 is absorbed and lost by the absorptive polarizer 110, and thus, the user cannot visually recognize the absorbed light.

Hereinafter, when the left circularly polarized (LCP) light is incident on the beam splitter 212 like the light of number 12 in FIG. 4, some thereof is transmitted through the beam splitter 212, and this light will be described in detail with reference to FIG. 6. This light may be associated with a ghost image.

Figure 6:
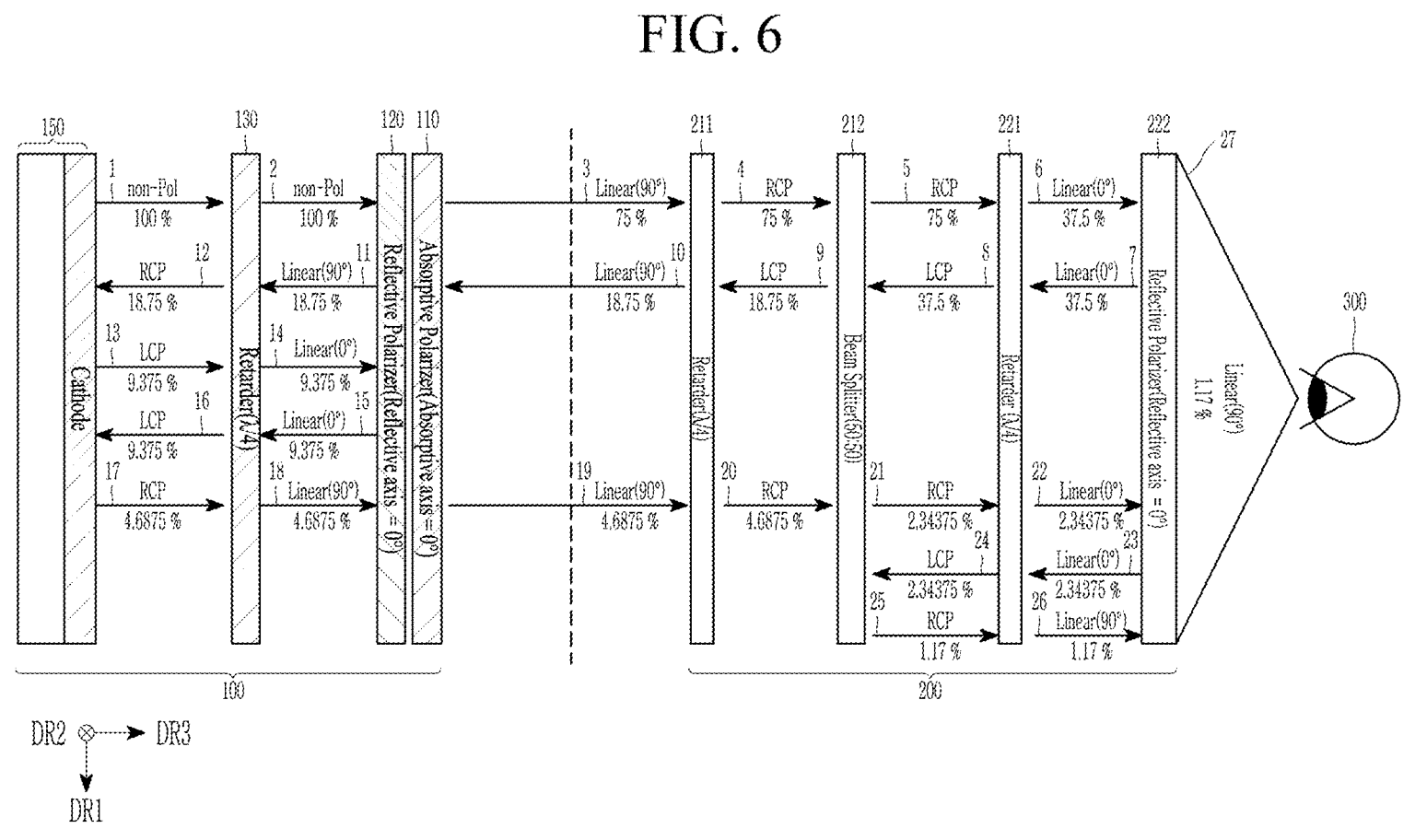

FIG. 6 illustrates a light path of a ghost image in the head mount display device according to the embodiment of FIG. 4.

Light of number 1 and light of number 2 in FIG. 6 correspond to the light of number 1 and the light of number 2 in FIG. 4, respectively, and light of number 3 in FIG. 6 corresponds to light in which the light of number 3 and the light of number 7 in FIG. 4 are combined and is the same as the light of number 3 in FIG. 5. On the other hand, light of number 4, light of number 5, light of number 6, light of number 7, and light of number 8 in FIG. 6 correspond to the light of number 8, the light of number 9, the light of number 10, the light of number 11, and the light of number 12 in FIG. 4, respectively.

Light of number 8 in FIG. 6 indicates that 37.5% of left-circularly polarized (LCP) light is incident back to the beam splitter 212. The beam splitter 212 reflects half (18.75%) of the incident light and transmits the other half (18.75%) The light of number 9 in FIG. 6 indicates the other half (18.75%) light transmitted from the beam splitter 212.

Referring to light of number 9 in FIG. 6, 18.75% of left-circularly polarized (LCP) light passes through the beam splitter 212 to be transmitted to the first retarder 211.

Referring to light of number 10 in FIG. 6, since 18.75% of the left-circularly polarized (LCP) light, while passing through the first retarder 211, is changed to 90° linearly polarized light, 18.75% of the 90° linearly polarized light is transmitted to the display panel 100 for the head mount display device.

Referring to light of number 11 in FIG. 6, when 18.75% of the 90° linearly polarized light is incident on the reflective polarizer 120 and the absorptive polarizer 110, since it has a polarization direction perpendicular to the reflective axis (0°) of the reflective polarizer 120 and the absorptive axis (0°) of the absorptive polarizer 110, it is transmitted as it is.

Referring to light of number 12 in FIG. 6, when 18.75% of the 90° linearly polarized light is incident on the retarder 130, it is changed to right-circularly polarized (RCP) light to be transmitted to the cathode (Cathode) of the light emitting diode as 18.75% of the right-circular polarized (RCP) light.

Referring to light of number 13 in FIG. 6, only half of the light incident on the cathode (Cathode) of the light emitting diode is reflected to be transmitted again in the third direction DR3. In this case, since the phase thereof is changed by 180 degrees, 9.375% of the left-circularly polarized (LCP) light is transmitted again to the retarder 130.

Referring to light of number 14 in FIG. 6, since 9.375% of the left-circularly polarized (LCP) light, while passing through the retarder 130, is changed to 0° linearly polarized light, 9.375% of the 0° linearly polarized light is transmitted to the reflective polarizer 120 and the absorptive polarizer 110.

Referring to light of number 15 in FIG. 6, since the reflective axis of the reflective polarizer 120 has 0°, 9.375% of the 0° linearly polarized light is all reflected as it is and is transmitted back to the retarder 130.

Referring to light of number 16 in FIG. 6, 9.375% of the 0° linearly polarized light incident on the retarder 130 is changed to 9.375% of the left-circularly polarized (LCP) light to be transmitted to the cathode (Cathode) of the light emitting diode LED.

Referring to light of number 17 in FIG. 6, only half of the light incident on the cathode (Cathode) of the light emitting diode is reflected to be transmitted back in the third direction DR3, and in this case, since the phase thereof is changed by 180 degrees, 9.375% of the left-circularly polarized (LCP) light is changed to 4.6875% of the right-circularly polarized (RCP) light to be transmitted in the third direction DR3.

Referring to light of number 18 in FIG. 6, 4.6875% of the right-circularly polarized (RCP) light, while passing through the retarder 130, is changed to 4.6875% of 90° linearly polarized light to be incident on the reflective polarizer 120.

Referring to light of number 19 in FIG. 6, the reflective axis of the reflective polarizer 120 has 0°, and since light of 90° perpendicular thereto is transmitted, 4.6875% of the 90° linearly polarized light is transmitted to the first retarder 211 as it is.

Referring to light of number 20 in FIG. 6, 4.6875% of the 90° linearly polarized light, while passing through the first retarder 211, is changed to 4.6875% of right-circularly polarized (RCP) light.

Referring to light of number 21 in FIG. 6, while 4.6875% of the right-circularly polarized (RCP) light is incident on the beam splitter 212, half thereof is transmitted and the other half thereof is reflected. Here, since the light of number 21 in FIG. 6 is light transmitted through the beam splitter 212, it becomes 2.34375% of right-circularly polarized (RCP) light.

Referring to light of number 22 in FIG. 6, 2.34375% of the right-circularly polarized (RCP) light, while passing through the second retarder 221, is changed to 2.34375% of 0° linearly polarized light and is transmitted to the reflective polarizer 222.

Referring to light of number 23 in FIG. 6, since the reflective axis of the reflective polarizer 222 has 0°, 2.34375% of the 0° light linearly polarized light is reflected at it is, and is transmitted back to the second retarder 221.

Referring to light of number 24 in FIG. 6, 2.34375% of the 0° linearly polarized light, while passing through the second retarder 221, is changed to 2.34375% of left-circularly polarized (LCP) light to be transmitted to the beam splitter 212.

Referring to light of number 25 in FIG. 6, half of the light incident on the beam splitter 212 is transmitted and the other half thereof is reflected, and the light of number in FIG. 6 is the reflected light, and when reflected, the phase thereof is changed by 180 degrees, so light after being reflected from the beam splitter 212 becomes 1.17% of right-circularly polarized (RCP) light.

Referring to light of number 26 in FIG. 6, 1.17% of the right-circularly polarized (RCP) light, while passing through the second retarder 221, becomes 1.17% of 90° linearly polarized light.

Referring to light of number 27 in FIG. 6, the reflective polarizer 222 has 0° as a reflective axis and 90° as a transmissive axis, so 1.17% of the 90° linearly polarized light is transmitted as it is to be transmitted to the user's eye 300. As described above, the light transmitted to the user's eyes may be recognized by the user as a ghost image, but compared to the transmittance (18.75%) of FIG. 4, it is relatively small, so it is difficult for the user to recognize the ghost image.

The reflective axis, the absorptive axis, and the retardation axis used in the above embodiment may have different angles from each other by a predetermined angle at 0°, 90°, and 45°. In this case, the predetermined angle may be larger than 0° and less than 5°.

On the other hand, in some embodiments, the reflective axis of the reflective polarizer 120 of the display panel 100 for the head mount display device and the reflective axis of the reflective polarizer 222 of the optical system 200 may form an angle of about 90 degrees.

However, it may be appropriate that the reflective axis of the reflective polarizer 120 of the display panel 100 for the head mount display device and the absorptive axis of the absorptive polarizer 110 are parallel to each other.

Hereinafter, a cross-sectional structure and a modified structure of the display panel 100 for the head mount display device will be described in detail with reference to FIG. 7 to FIG. 9.

A structure of the display panel 100 for the head mount display device according to an embodiment will be described with reference to FIG. 7.

Figure 7:
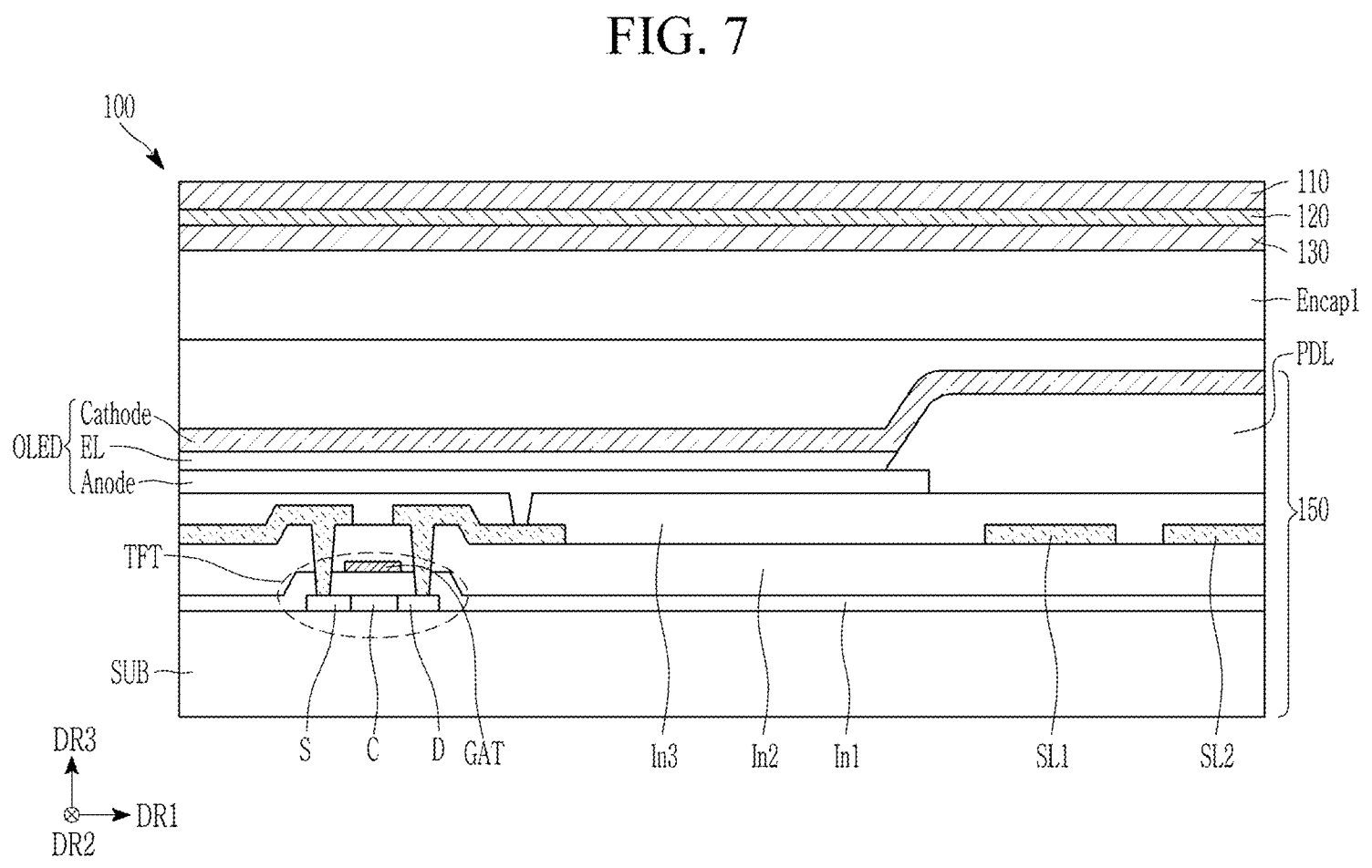

FIG. 7 illustrates a detailed cross-sectional view of a display panel for a head mount display device according to an embodiment.

The display panel 100 used in the head mount display device according to the embodiment of FIG. 7 shows an organic light emitting panel including an organic light emitting element (OLED).

Although FIG. 7 shows components up to the cathode (Cathode) of the light emitting diode shown in an uppermost layer of the light emitting element part 150 in FIG. 2 and the like, an encapsulation substrate (encap1) may be additionally included thereon.

The retarder 130, the reflective polarizer 120, and the absorptive polarizer 110 are sequentially formed on the encapsulation substrate (encap1), but since this has already been discussed, hereinafter, the remaining constituent elements will be mainly described.

In the organic light emitting panel including the organic light emitting element (OLED), a substrate SUB may include an inorganic insulating material such as glass or an organic insulating material such as plastic such as polyimide ("PI"). The substrate SUB may have a structure in which at least one base layer and at least one inorganic layer, which include polymer resins sequentially stacked, are alternately stacked. The substrate SUB may have various degrees of flexibility. The substrate SUB may be a rigid substrate, or a flexible substrate that is bendable, foldable, or rollable.

A semiconductor layer is positioned on the substrate SUB. The semiconductor layer may include polycrystalline silicon or an oxide semiconductor. The semiconductor layer includes a channel area (C), a first area(S), and a second area (D). The first area(S) and the second area (D) are disposed at respective sides of the channel area (C). The channel area (C) is a semiconductor area that is doped with a small amount of impurity compared with that of the first area(S) and the second area (D) or that is doped with no impurity, and the first area(S) and the second area (D) are each a semiconductor area doped with a large amount of impurity compared with that of the channel area (C).

A first inorganic insulating layer In1 is positioned on the semiconductor layer. The first inorganic insulating layer In1 may have a single-layered or multi-layered structure including at least one of a silicon oxide ($SiO_x$), a silicon nitride ($SiN_x$), and a silicon oxynitride (SiOxNy).

A first gate conductive layer including a gate electrode GAT is positioned on the first inorganic insulating layer In1. The first gate conductive layer may be a single layer or multilayer in which metal films containing one of copper (Cu), a copper alloy, aluminum (Al), an aluminum alloy, molybdenum (Mo), a molybdenum alloy, titanium (Ti), and a titanium alloy are stacked. The gate electrode GAT may overlap the channel area (C) of the semiconductor layer in a plan view.

The channel area (C), the semiconductor layer including the first area(S) and the second area (D), and the gate electrode GAT overlapping the channel area (C) may form one transistor TFT.

A second inorganic insulating layer In2 is positioned on the first gate conductive layer and the first inorganic insulating layer In1. The second inorganic insulating layer In2 is a single layer or multilayer including at least one of a silicon oxide ($SiO_x$), a silicon nitride ($SiN_x$), and a silicon oxynitride ($SiO_xN_y$).

A first data conductive layer including electrodes (a source electrode and a drain electrode) and signal lines SL1 and SL2 connected to the first area(S) and the second area (D) of the semiconductor layer is positioned on the second inorganic insulating layer In2. The source electrode and the drain electrode may be electrically connected to the first area(S) and the second area (D) of the semiconductor layer through a contact hole formed in the second inorganic insulating layer In2, respectively. In some embodiments, the semiconductor layer may directly extend without a source electrode and a drain electrode to be electrically connected to an adjacent pixel. The first data conductive layer may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and may have a single-layered or multi-layered structure including them.

In some embodiments, a second gate conductive layer and an additional inorganic insulating layer may be further included on the second inorganic insulating layer In2 and between the first data conductive layers. The second gate conductive layer may include a storage electrode that overlaps the gate electrode of the first gate conductive layer to form a storage capacitor. An additional inorganic insulating layer covers the second gate conductive layer to insulate it from the first data conductive layer.

A first organic insulating layer In3 is positioned on the first data conductive layer. The first organic insulating layer In3 is positioned. The first organic insulating layer In3 may include an organic insulating material such as a general-purpose polymer such as polymethyl methacrylate (PMMA) or polystyrene ("PS"), a polymer derivative having a phenolic group, an acryl-based polymer, an imide-based polymer, a polyimide, an acryl-based polymer, and a siloxane-based polymer.

An opening may be positioned in the first organic insulating layer In3, and one electrode of the transistor TFT and an anode (Anode) are electrically connected to each other.

The anode (Anode) is positioned on the first organic insulating layer In3. The anode (Anode) is electrically connected to the transistor TFT through the opening of the first organic insulating layer In3. The anode (Anode) may contain a metal such as silver (Ag), lithium (Li), calcium (Ca), aluminum (Al), magnesium (Mg), or gold (Au), and may also contain a transparent conductive oxide ("TCO") such as an indium tin oxide ("ITO") or an indium zinc oxide ("IZO"). The anode (Anode) may be formed as a single layer including a metal material or a transparent conductive oxide, or a multilayer including them.

A pixel defining layer PDL is positioned on the first organic insulating layer In3 and the anode (Anode). The pixel defining layer PDL overlaps at least a portion of the anode (Anode), and has an opening defining a light emitting area. The opening may have a planar shape substantially similar to the anode (Anode). The opening may have a rhombus or an octagonal shape similar to a rhombus in a plan view, but is not limited thereto, and may have various shapes such as a quadrangle, a polygon, a circle, or an ellipse.

The pixel defining layer PDL may include an organic insulating material such as a general-purpose polymer such as polymethyl methacrylate (PMMA) or polystyrene (PS), a polymer derivative having a phenolic group, an acryl-based polymer, an imide-based polymer, a polyimide, an acryl-based polymer, and a siloxane-based polymer.

An intermediate layer EL is positioned on the pixel defining layer PDL and the anode (Anode). The intermediate layer EL may include a light emitting layer and a functional layer. The light emitting layer of the intermediate layer EL may generate light of a predetermined color. The light emitting layer may include an organic material and/or an inorganic material. The light emitting layer of the present embodiment may be formed only within the opening of the pixel defining layer PDL.

Meanwhile, the functional layer of the intermediate layer EL may include at least one of a hole injection layer, a hole transporting layer, an electron transporting layer, and an electron injection layer. The functional layer may be divided into a first functional layer positioned between the anode (Anode) and the light emitting layer, and a second functional layer positioned between the light emitting layer and the cathode (Cathode). Each functional layer may have a shape overlapping the entire surface of the substrate SUB. The functional layer may be entirely disposed on a plurality of pixels.

The cathode (Cathode) is positioned on the intermediate layer EL. The cathode (Cathode) may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), lithium (Li), or calcium (Ca), or a transparent conductive oxide (TCO) such as an indium tin oxide (ITO) or an indium zinc oxide (IZO).

The anode (Anode), the intermediate layer EL, and the cathode (Cathode) may configure an organic light emitting element OLED. However, the embodiment is not necessarily limited thereto, and a first electrode E1 may be a cathode and a second electrode E2 may be an anode, according to a driving method of the light emitting display device.

Holes and electrons are injected into the intermediate layer EL from the anode (Anode) and the cathode (Cathode), respectively, and light is emitted when excitons in which the injected holes and electrons are combined enter a ground state from an excited state.

An encapsulation substrate (encap1) is positioned on the cathode (Cathode), and the encapsulation substrate (encap1) may be attached by an adhesive or a seal member.

The encapsulation substrate (encap1) may be formed of optically isotropic glass or polymethyl methacrylate (PMMA).

The encapsulation substrate (encap1) serves to seal the organic light emitting element OLED to block the inflow of external moisture and oxygen because the organic light emitting element is very vulnerable to moisture and oxygen.

A spacer (not shown) may be further formed on the pixel defining layer PDL, and it allows the pixel defining layer PDL to be maintained from the encapsulation substrate by a distance. In this case, the spacer may be formed under the cathode (Cathode).

Although only one transistor TFT is shown in FIG. 7, each actual pixel may include two or more transistors.

Figure 8A:
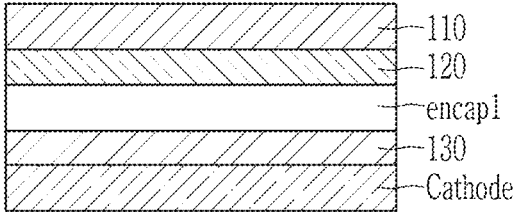
FIGS. 8A to 8C illustrate schematic cross-sectional views of a display panel for a head mount display device according to various embodiments.
Figure 8B:
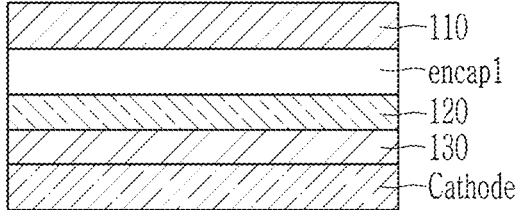
Figure 8C:
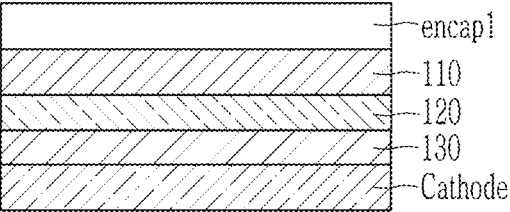

FIG. 7 shows the embodiment in which the retarder 130, the reflective polarizer 120, and the absorptive polarizer 110 are sequentially formed on the encapsulation substrate (encap1), but the embodiment may be modified as shown in FIGS. 8A to 8C.

Hereinafter, modified structures of the display panel 100 for the head mount display device will be described with reference to FIGS. 8A to 8C.

FIGS. 8A to 8C illustrate schematic cross-sectional views of a display panel for a head mount display device according to various embodiments.

FIGS. 8A to 8C illustrate, unlike FIG. 7, instead of showing a detailed cross-sectional structure, only the encapsulation substrate (encap1) and the cathode (Cathode) to briefly illustrate a vertical relationship of respective layers.

FIG. 8A illustrates an embodiment in which the retarder 130 is positioned under the encapsulation substrate (encap1). That is, in the display panel 100 for the head mount display device according to FIG. 8A, the retarder 130 is positioned on the cathode (Cathode) of the light emitting diode, the encapsulation substrate (encap1) is positioned thereon, and the reflective polarizer 120 and the absorptive polarizer 110 are formed thereon.

On the other hand, referring to FIG. 8B, the reflective polarizer 120 may also be positioned under the encapsulation substrate (encap1). That is, in the display panel 100 for the head mount display device according to FIG. 8B, the retarder 130 and the reflective polarizer 120 are positioned on the cathode (Cathode) of the light emitting diode, the encapsulation substrate (encap1) is positioned thereon, and the absorptive polarizer 110 is formed thereon.

On the other hand, FIG. 8C illustrates an embodiment in which the encapsulation substrate (encap1) is positioned on the absorptive type of polarizer 110. That is, in the display panel 100 for the head mount display device according to FIG. 8C, the retarder 130, the reflective polarizer 120, and the absorptive polarizer 110 are positioned on the cathode (Cathode) of the light emitting diode, and the encapsulation substrate (encap1) is positioned thereon.

Here, the encapsulation substrate (encap1) is formed of glass or polymethyl methacrylate (PMMA) as in the substrate SUB, and thus, since it is easy to attach an optical film to one side thereof, a modification such as FIG. 8A to FIG. 8C is possible.

Meanwhile, in addition to the examples shown in FIGS. 8A to 8C, an additional optically isotropic layer may be further included between respective optical layers (or films) when the order of the retarder 130, the reflective polarizer 120, and the absorptive polarizer 110 is maintained.

Meanwhile, in some embodiments, the encapsulation layer may be formed by stacking an insulating film instead of the encapsulation substrate (encap1), which will be described with reference to FIG. 9.

Figure 9:
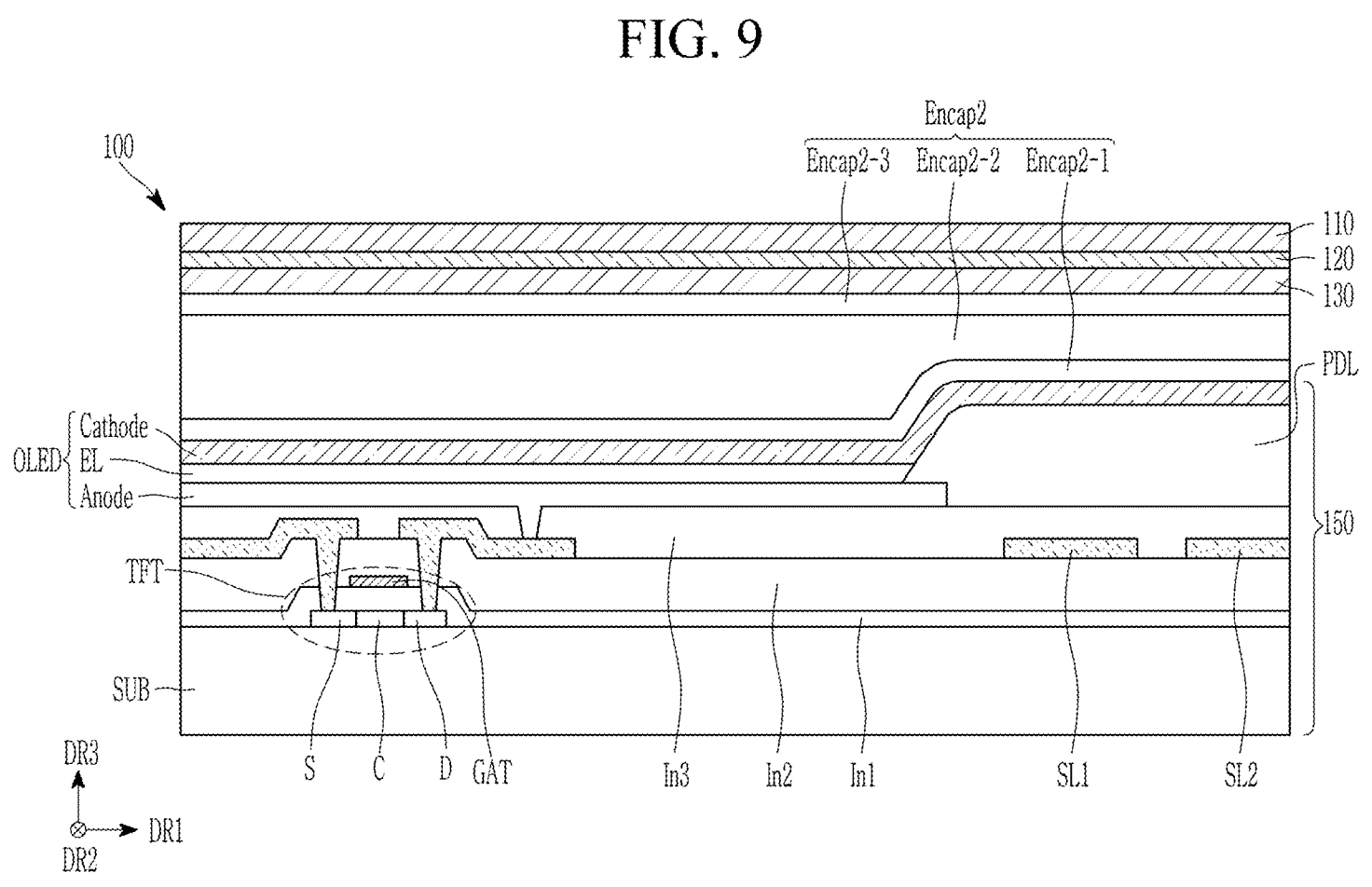

FIG. 9 illustrates a detailed cross-sectional view of a display panel for a head mount display device according to another embodiment.

In FIG. 9, unlike FIG. 7, an encapsulation layer (encap2) including three insulating layers is disposed on the cathode (Cathode) instead of the encapsulation substrate (encap1).

The encapsulation layer (encap2) is a layer for blocking moisture and oxygen from flowing into the organic light emitting element OLED, and may have a structure including a plurality of insulating layers, and may be a composite film including both an inorganic layer and an organic layer. FIG. 9 shows the encapsulation layer (encap2) according to the embodiment, in which a first encapsulation inorganic layer (encap2-1), an encapsulation organic layer (encap2-2), and a second encapsulation inorganic layer (encap2-3) are sequentially stacked as a triple layer.

The first encapsulation inorganic layer (encap2-1) covers the cathode (Cathode), and may include a silicon nitride, a silicon oxide, or an inorganic compound in combination thereof.

The encapsulation organic layer (encap2-2) may be disposed on the first encapsulation inorganic layer (encap2-1) to be in contact with the first encapsulation inorganic layer (encap2-1). A curved surface formed on an upper surface of the first encapsulation inorganic layer (encap2-1) or particles existing on the first encapsulation inorganic layer (encap2-1)

may be covered by the encapsulation organic layer (encap2-2), and may be planarized by the encapsulation organic layer (encap2-2).

The second encapsulation inorganic layer (encap2-3) is disposed on the encapsulation organic layer (encap2-2) to cover the encapsulation organic layer (encap2-2). The second encapsulation inorganic layer (encap2-3) may include a silicon nitride, a silicon oxide, or a combination thereof.

In the above, the embodiment in which the three retarders 130, 211, and 221 used all have a positive wavelength dispersion characteristic and provide the phase retardation of $\lambda/4$ with respect to the retardation axis has been described. However, since all the retarders 130, 211, and 221 provide the phase retardation of $\lambda/4$, the light passing through the retarders 130, 211, and 221 several times, while being accumulated, may cause a problem of having undesired polarization characteristics. Accordingly, in some embodiments, at least one of the three retarders 130, 211, and 221 may provide a phase retardation of $-\lambda/4$ with respect to the retardation axis to have an inverse wavelength dispersion characteristic.

Hereinafter, an embodiment including an inverse dispersion characteristic will be described with reference to FIG. 10.

Figure 10:
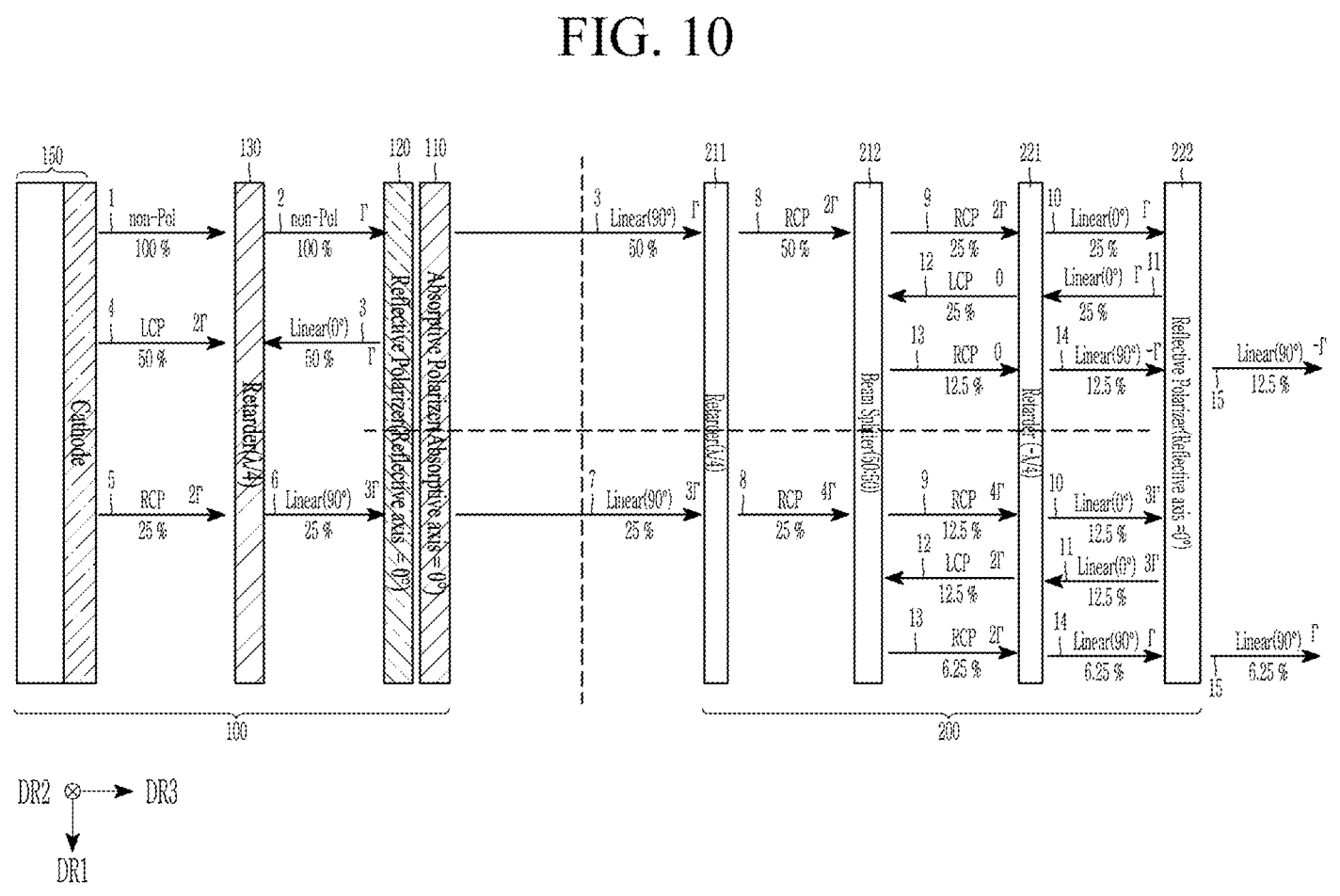

FIG. 10 illustrates a light path and transmittance of a head mount display device according to another embodiment.

In FIG. 10, unlike the embodiment of FIG. 4, the second retarder 221 has the inverse dispersion characteristic that provides the phase retardation of $-\lambda/4$ with respect to the retardation axis.

FIG. 10, unlike FIG. 4, illustrates the embodiment in which while additionally showing gamma ($\Gamma$), one gamma ($\Gamma$) is added when it is a positive wavelength dispersion characteristic, and one gamma ($\Gamma$) is subtracted when it is an inverse dispersion characteristic, and how much wavelength dispersibility it has.

In addition, unlike FIG. 4, FIG. 10 also illustrates wavelength dispersibility by separating light (light of number 3 and light of number 7) provided from the display panel 100 for the head mount display device, respectively.

In addition to the light path and transmittance shown in FIG. 10, the wavelength dispersibility will also be described.

Light of number 1 and light of number 7 in FIG. 10 are the same as in FIG. 4, but since contents of the wavelength dispersibility is further illustrated, only the wavelength dispersibility will be additionally described.

Light of number 3 passes through the retarder 130 only once in the display panel 100 for the head mount display device, so it has one gamma ($\Gamma$) value. On the other hand, the light of number 7 passes through the retarder 130 a total of 3 times, so it has three gamma ($\Gamma$) values, that is, $3\Gamma$.

Due to such a difference in wavelength dispersibility, the light of number 3 and the light of number 7 will be separately described from each other, and hereinafter, a change in light in the optical system 200 will be described in detail.

The light of number 3 incident on the optical system 200 will be described.

The light of number 3 is 50% of 90° linearly polarized (Linear) light, and has one gamma ($\Gamma$) value, and referring to light of number 8, 50% of the 90° linearly polarized light transmitted to the optical system 200, while passing through the first retarder 211, is changed to right-circularly polarized (RCP) light to be transmitted as 50% of the right-circularly polarized (RCP) light, and in this case, the wavelength dispersibility characteristic has a value of $2\Gamma$.

Referring to light of number 9, since 50% of the right-circularly polarized (RCP) light passes through the beam splitter 212 and only half thereof is transmitted, 25% of the right-circularly polarized (RCP) light is transmitted in the third direction DR3. The beam splitter 212 does not provide a phase difference, so light of number 9 still has a wavelength dispersibility value of $2\Gamma$.

Referring to light of number 10, the second retarder 221 changes the right-circularly polarized (RCP) light to 0° linearly polarized light, that is, to 25% of the 0° linearly polarized light. In this case, since the second retarder 221 provides inverse wavelength dispersibility ($-\lambda/4$), wavelength dispersibility of light passing through the second retarder 221 is reduced to $\Gamma$.

Referring to light of number 11, since the reflective polarizer 222 has 0° as a reflective axis, all light of 0° is reflected and transmitted back to the second retarder 221, so that 25% of the light having the linear polarization of 0° and having wavelength dispersibility of $\Gamma$ is incident back on the second retarder 221.

Referring to light of number 12, 25% of the light having the linear polarization of 0° and having wavelength dispersibility of $\Gamma$ is changed to left-circularly polarized (LCP) light while it passes through the second retarder 221, resulting in 25% of the left-circularly polarized (LCP) light, and the wavelength dispersion value is 0 due to the inverse wavelength dispersibility ($-\lambda/4$) of the second retarder 221.

Referring to light of number 13, 25% of the left-circularly polarized (LCP) light is incident on the beam splitter 212, and 12.5% of the light, which is half of the incident light, is reflected, and when reflected from the beam splitter 212, since the phase thereof is changed by 180 degrees, 12.5% of the right-circularly polarized (RCP) light is transmitted back in the third direction DR3 to be incident on the second retarder 221.

Referring to light of number 14, 12.5% of the right-circularly polarized (RCP) light, while passing through the second retarder 221, is changed to 90° linearly polarized (Linear) light, and due to the inverse wavelength dispersibility ($-\lambda/4$) of the second retarder 221, the wavelength dispersion value is $-\Gamma$.

Referring to light of number 15, since the reflective polarizer 222 has 0° as a reflective axis and 0° perpendicular thereto as a transmissive axis, all incident linearly polarized (Linear) light of 90° is transmitted. Accordingly, as 12.5% of the 90° linearly polarized light, light with a wavelength dispersion value of $-\Gamma$ is transmitted to the user's eyes.

Hereinafter, light of number 7 incident on the optical system 200 will be described.

The light of number 7 is 25% of 90° linearly polarized (Linear) light and has a value of $3\Gamma$ as a wavelength dispersion value, and referring to light of number 8, 25% of the 90° linearly polarized light transmitted to the optical system 200, while passing through the first retarder 211, is changed to right-circularly polarized (RCP) light to be transmitted as 25% of the right-circularly polarized (RCP) light, and in this case, the wavelength dispersibility has a value of $4\Gamma$.

Referring to light of number 9, since 25% of the right-circularly polarized (RCP) light passes through the beam splitter 212 and only half thereof is transmitted, 12.5% of the right-circularly polarized (RCP) light is transmitted in the third direction DR3. The beam splitter 212 does not provide a phase difference, so light of number 9 still has a wavelength dispersion value of $4\Gamma$.

Referring to light of number 10, the second retarder 221 changes the right-circularly polarized (RCP) light to 0° linearly polarized light, that is, to 12.5% of the 0° linearly polarized light. In this case, since the second retarder 221 provides inverse wavelength dispersibility (−λ/4), wavelength dispersibility of light passing through the second retarder 221 is reduced to 31.

Referring to light of number 11, since the reflective polarizer 222 has 0° as a reflective axis, all light of 0° is reflected and transmitted back to the second retarder 221, so that 12.5% of the light having the linear polarization of 0° and having dispersibility of 3Γ is incident back on the second retarder 221.

Referring to light of number 12, 12.5% of the light having the linear polarization of 0° and having wavelength dispersibility of 3Γ is changed to left-circularly polarized (LCP) light while passes through the second retarder 221, resulting in 12.5% of the left-circularly polarized (LCP) light, and the wavelength dispersion value is 21 due to the inverse wavelength dispersibility (−λ/4) of the second retarder 221.

Referring to light of number 13, 12.5% of the left-circularly polarized (LCP) light is incident on the beam splitter 212, and 6.25% of the light, which is half of the incident light, is reflected, and when reflected from the beam splitter 212, since the phase thereof is changed by 180 degrees, 6.25% of the right-circularly polarized (RCP) light is transmitted back in the third direction DR3 to be incident on the second retarder 221.

Referring to light of number 14, 6.25% of the right-circularly polarized (RCP) light, while passing through the second retarder 221, is changed to 90° linearly polarized (Linear) light, and due to the inverse wavelength dispersibility (−λ/4) of the second retarder 221, the wavelength dispersion value is Γ.

Referring to light of number 15, since the reflective polarizer 222 has 0° as a reflective axis and 0° perpendicular thereto as a transmissive axis, all incident linearly polarized (Linear) light of 90° is transmitted. Accordingly, as 6.25% of the 90° linearly polarized light, light with a wavelength dispersion value of Γ is transmitted to the user's eyes.

In FIG. 10, the light transmitted to the user's eye is 12.5% of the 90° linearly polarized light, and in this light, there are light having a wavelength dispersion value of −Γ and light having a wavelength dispersion value of Γ as 6.25% of the 90° linearly polarized light.

The two lights have the same polarization direction, but the wavelength dispersion values thereof are different from each other by −Γ and Γ. Therefore, they have the advantage that the wavelength dispersibility is alleviated without being biased to one side by complementing each other.

In some embodiments, two retarders having inverse wavelength dispersibility may be included, and the other retarders 130 and 211 may have inverse wavelength dispersibility instead of the second retarder 221. For example, instead of the second retarder 221, the retarder 130 included in the display panel 100 for the head mount display device may be formed to have inverse wavelength dispersibility. In this case, the retarders 211 and 221 included in the optical system 200 may have positive wavelength dispersibility.

Hereinafter, a head mount display device according to another embodiment will be described with reference to FIG. 11 to FIG. 14E, and light emitted from a display panel 100_1 for a head mount display device included in a head mount display device of FIG. 11 to FIG. 14E has a characteristic of circularly polarized light emitted without a separate retarder.

Figure 11:
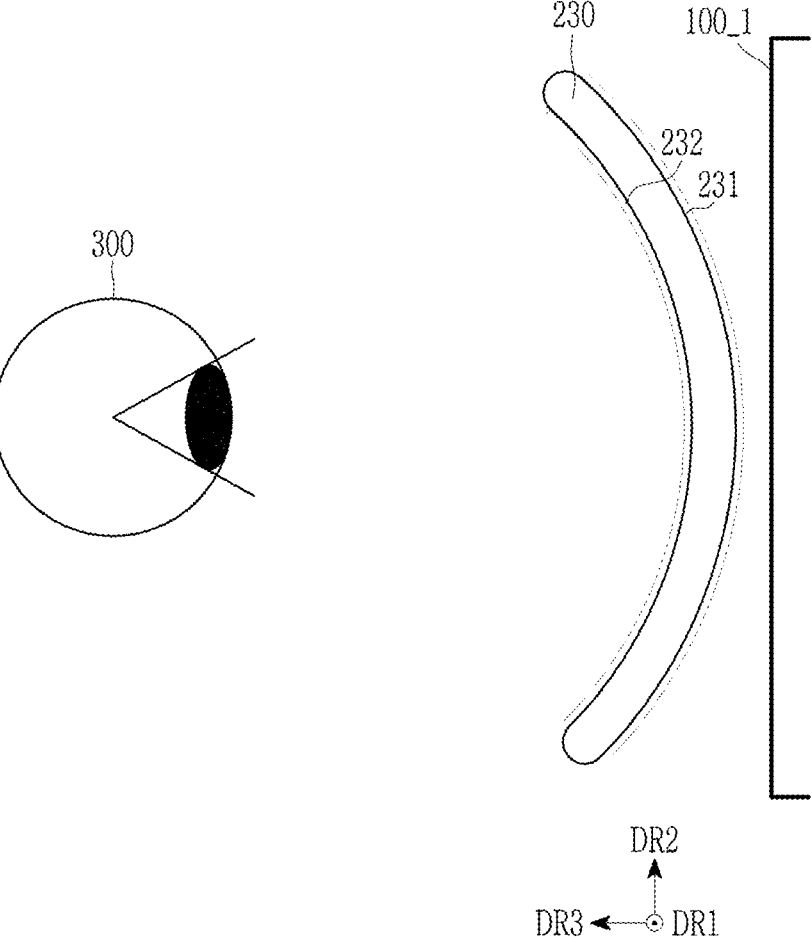
FIG. 11 illustrates a schematic cross-sectional view of a head mount display device according to another embodiment.

As such, when the display panel 100_1 for the head mount display device emits the circularly polarized light without a retarder, a single curved lens 230 (pancake lens) may be included as shown in FIG. 11.

Hereinafter, another head mount display device will be described in detail with reference to FIG. 11.

FIG. 11 illustrates a schematic cross-sectional view of a head mount display device according to another embodiment.

The head mount display device according to the embodiment of FIG. 11 mainly includes a display panel 100_1 (hereinafter also referred to as a display panel for a head mount display device) and an optical system positioned in front of the display panel 100_1. Here, the light emitting element part 150_1 of the display panel 100_1 for the head mount display device emits circularly polarized light without a separate retarder, and the optical system may include the single curved lens 230 (hereinafter referred to as a pancake lens). In addition, since optical films 231 and 232 are disposed on opposite surfaces of the single curved lens 230, the number of optical films included in the optical system may be reduced by half compared with the embodiment of FIG. 1.

The optical system according to the embodiment will be described in detail with reference to FIG. 11.

A retarder 231 (hereinafter also referred to as an optical system retarder) is disposed to face the display panel 100_1 (in an opposite direction of the third direction DR3, hereinafter referred to as an inner side) on the inner side single curved lens 230 included in the optical system, and a reflective polarizer 232 (hereinafter also referred to as an optical system reflective polarizer) is formed at the outer side (the third direction DR3) of the single curved lens 230. The reflective polarizer 232 is positioned between the user's eye 300 and the single curved lens 230.

The retarder 231 may also be referred to as a λ/4 plate, and it may change linear polarization to circular polarization or change circular polarization to linear polarization by providing a phase difference of λ/4 with respect to a retardation axis. The reflective polarizer 232 has a reflective axis, reflects linear polarization of the reflective axis, and transmits linear polarization of a direction perpendicular thereto. The reflective polarizer 232 may have a wire grid structure in which a plurality of metal lines having a fine width are arranged in one direction, and may reflect light parallel to an arrangement direction of the metal lines and transmit light perpendicular thereto. In this case, a distance between the plurality of metal lines may be narrower than a wavelength of visible light.

The curved lens 230 included in the optical system may be made of an optically isotropic material, for example, glass, or a curved surface of the curved lens 230 may be formed of a spherical surface or an aspherical surface. It may be formed of polymethyl methacrylate or the like.

In the display panel 100_1 for the head mount display device included in the embodiment of FIG. 11, unlike the embodiment of FIG. 2, a separate optical film (the absorptive polarizer 110, the reflective polarizer 120, the retarder 130, or the like in FIG. 2) may not be formed on the front surface of the cathode (Cathode).

Hereinafter, a light path and transmittance of the overall head mount display device will be described with reference to FIG. 12.

Figure 12:
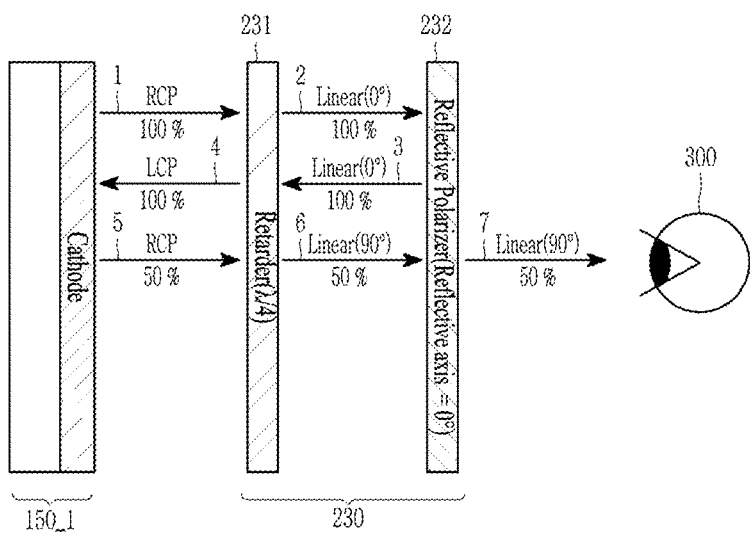
FIG. 12 illustrates a light path and transmittance of the head mount display device according to the embodiment of FIG. 11.
Figure 12:
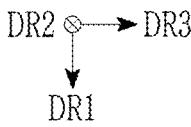

FIG. 12 illustrates a light path and transmittance of the head mount display device according to the embodiment of FIG. 11.

As shown in FIG. 12, in the display panel 100_1 for the head mount display device, a separate film is not formed on the cathode (Cathode) of the light emitting element part

150_1. However, as shown in FIG. 13 and FIGS. 14A to 14E, a light emitting layer of a light emitting diode includes a material that emits one of left-circularly polarized (LCP) light and right-circularly polarized (RCP) light, and as one of them, a chiral luminophore material or a helix structure light emitting material may be included, and circularly polarized light may be emitted through a birefringence method, or may be formed in one of various methods illustrated in FIGS. 14A to 14E.

Referring to light of number 1 in FIG. 12, the light emitting diode of the display panel 100_1 for the head mount display device according to the embodiment emits right-circularly polarized (RCP) light without a separate optical film. As a result, 100% of the light is emitted from the display panel 100_1 for the head mount display device without loss of light to be incident on the optical system.

Referring to light of number 2, the retarder 231 changes the right-circularly polarized (RCP) light to 0° linearly polarized light, that is, to 100% of the 0° linearly polarized light.

Referring to light of number 3, the reflective polarizer 232 has 0° as a reflective axis, so all the light of 0° is reflected to be transmitted back to the retarder 231.

Referring to light of number 4, 100% of the 0° linearly polarized light, while passing through the retarder 231, is changed to left-circularly polarized (LCP) light, so that 100% of the left-circularly polarized (LCP) light is transmitted to the cathode (Cathode).

Referring to light of number 5, since the cathode (Cathode) reflects half of the incident light, 50% of the light is transmitted in the third direction DR3, and when it is reflected, a phase difference is generated by 180 degrees, so it, while being changed to the right circularly polarized (RCP) light, is transmitted back in the third direction DR3 to be incident on the retarder 231.

Referring to light of number 6, 50% of right-circularly polarized (RCP) light, while passing through the retarder 231, is changed to 90° linearly polarized (Linear) light.

Referring to light of number 7, since the reflective polarizer 232 has 0° as a reflective axis and 0° perpendicular thereto as a transmissive axis, all incident linearly polarized (Linear) light of 90° is transmitted. Accordingly, 50% of the 90° linearly polarized light is transmitted to the user's eyes.

Referring to FIG. 12, it can be seen that 50% of the light emitted from the light emitting diode of the display panel 100_1 for the head mount display device is transmitted to the user's eyes, so that it is possible to provide very high light efficiency.

In addition, the optical system also uses only one retarder 231 and includes only two optical films (the retarder 231 and the reflective polarizer 232), and a separate optical film is not used in the display panel 100_1 for the head mount display device, so that it can be seen that the light efficiency is high.

In addition, since even a weight of the head mount display device is small, there is an advantage that the user is less fatigued even when using it for a long time.

Hereinafter, a structure of a light emitting layer capable of emitting the circularly polarized light from the display panel 100_1 for the head mount display device will be schematically described with reference to FIG. 13 and FIGS. 14A to 14E.

FIG. 13 and FIGS. 14A to 14E illustrate in detail an example of a light emitting layer of the display panel for the head mount display device according to the embodiment of FIG. 11.

Figure 13:
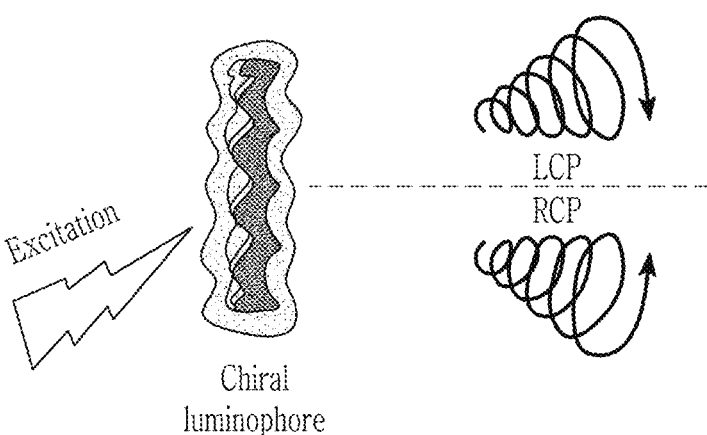

Referring to FIG. 13, the light emitting layer uses a material included in a chiral luminophore to be able to emit either left-circularly polarized (LCP) or right-circularly polarized (RCP) light.

FIGS. 14A to 14E illustrate examples of five light emitting layers.

Figure 14A:
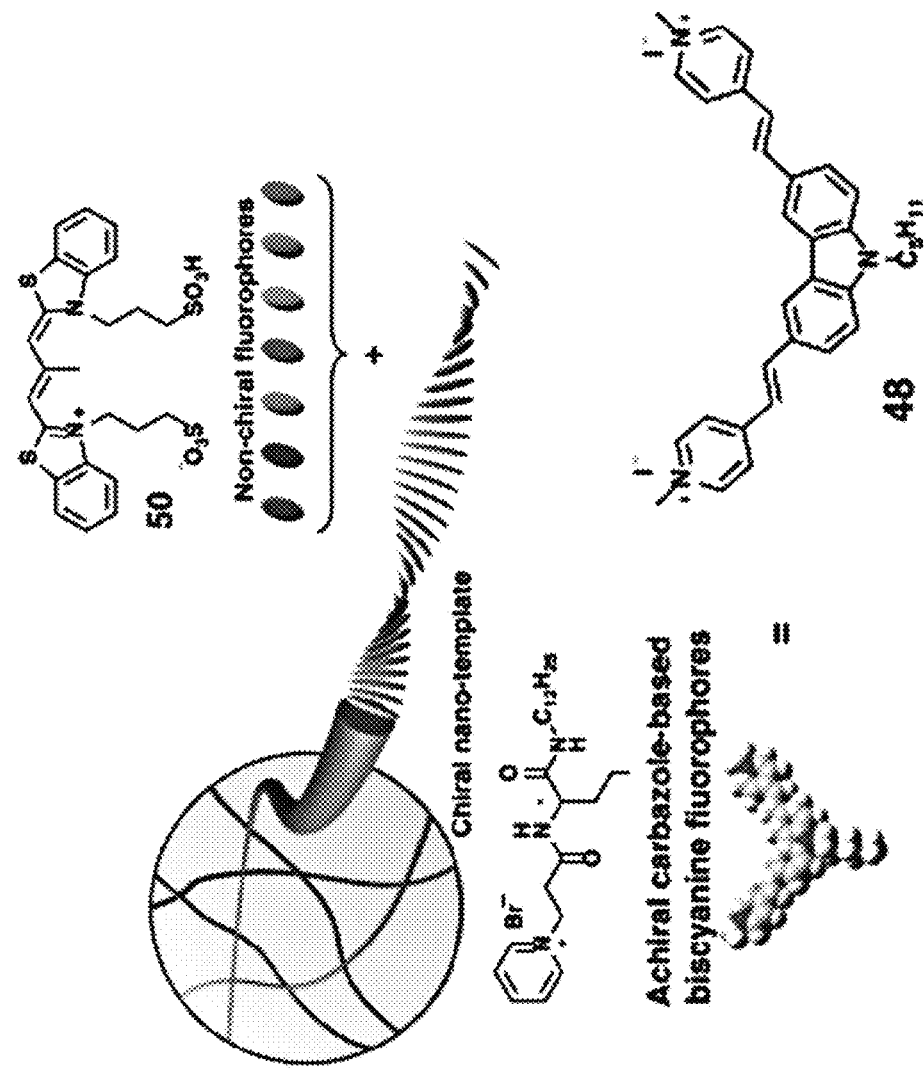

FIG. 14A schematically shows that a light emitting layer material may be formed by including fluorophores not having a chiral structure in a nano-template having a chiral structure.

Figure 14B:
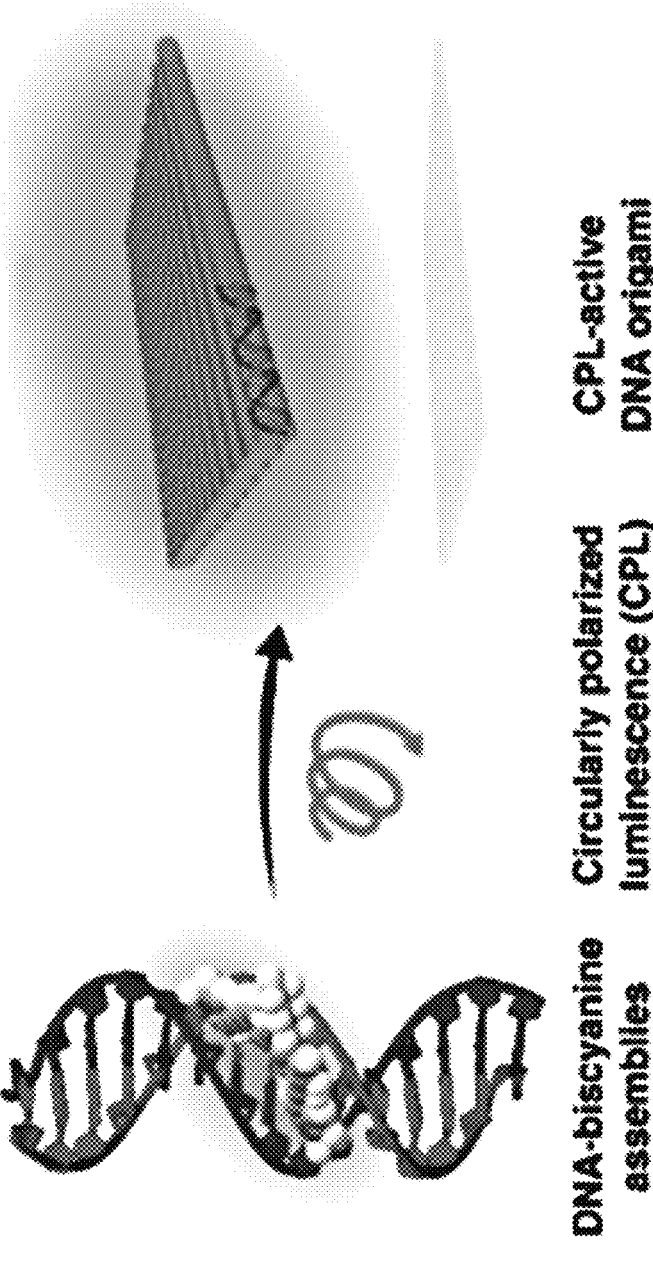
Figure 14C:
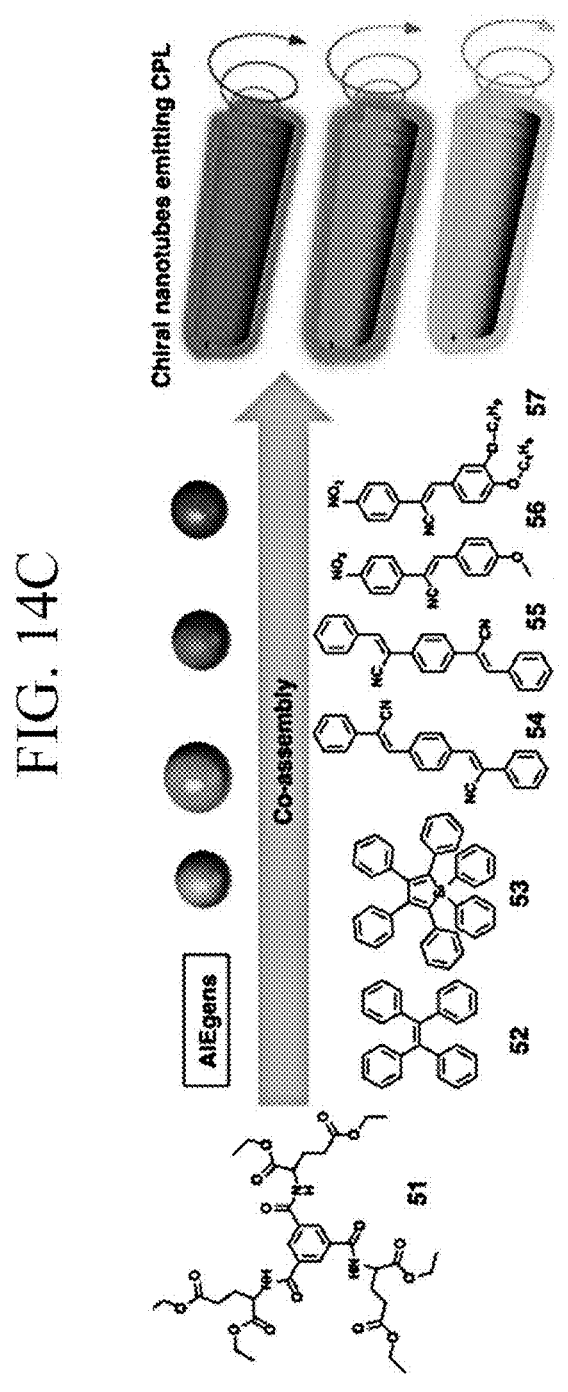

FIG. 14B shows a method of binding a circularly polarized light emitter ("CPL") to a structure of DNA, and FIG. 14C shows a method in which a chiral nanotube is formed by binding AIEgens, which is a bio-material, to emit light of the circularly polarized light.

Figure 14D:
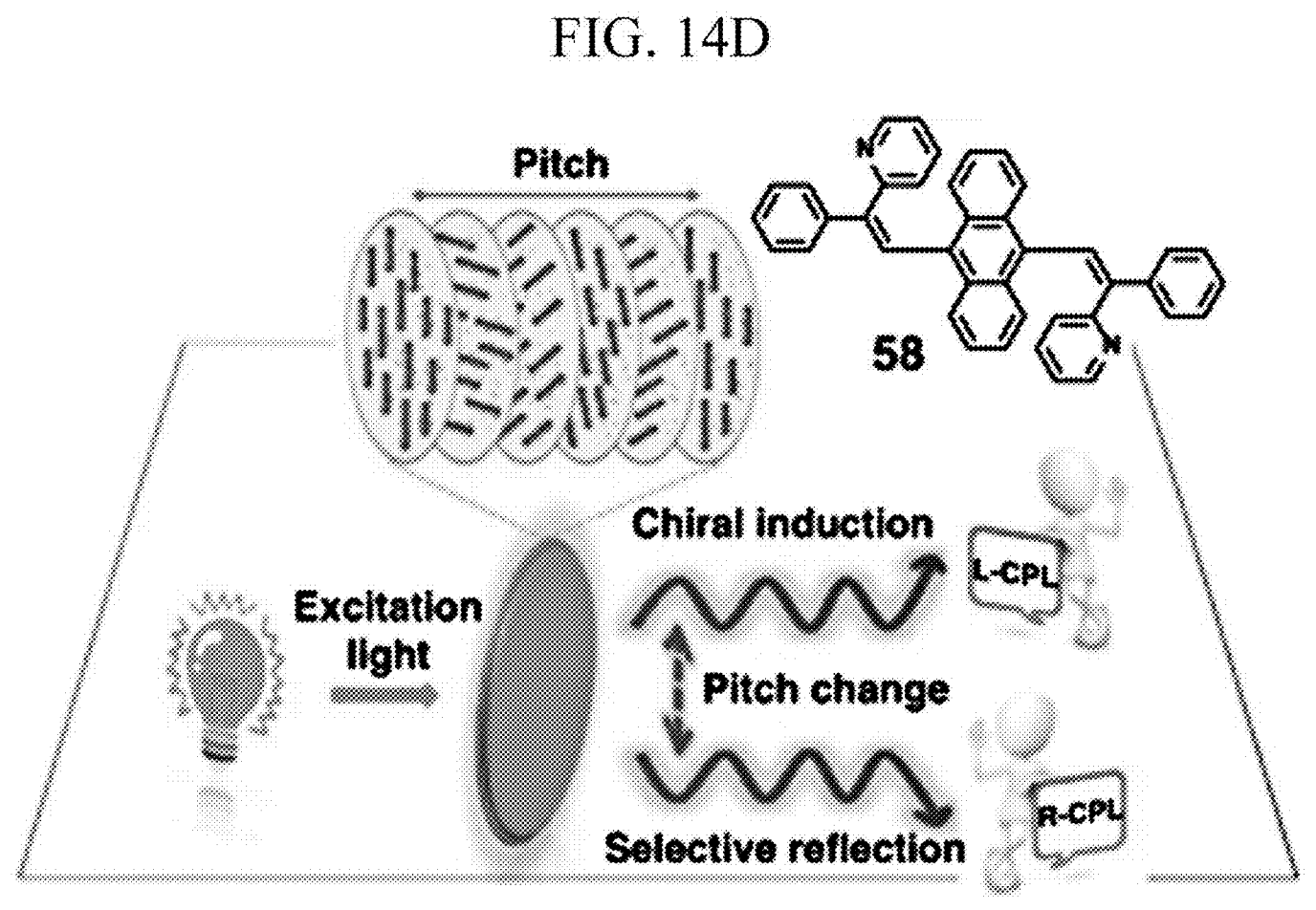
Figure 14E:
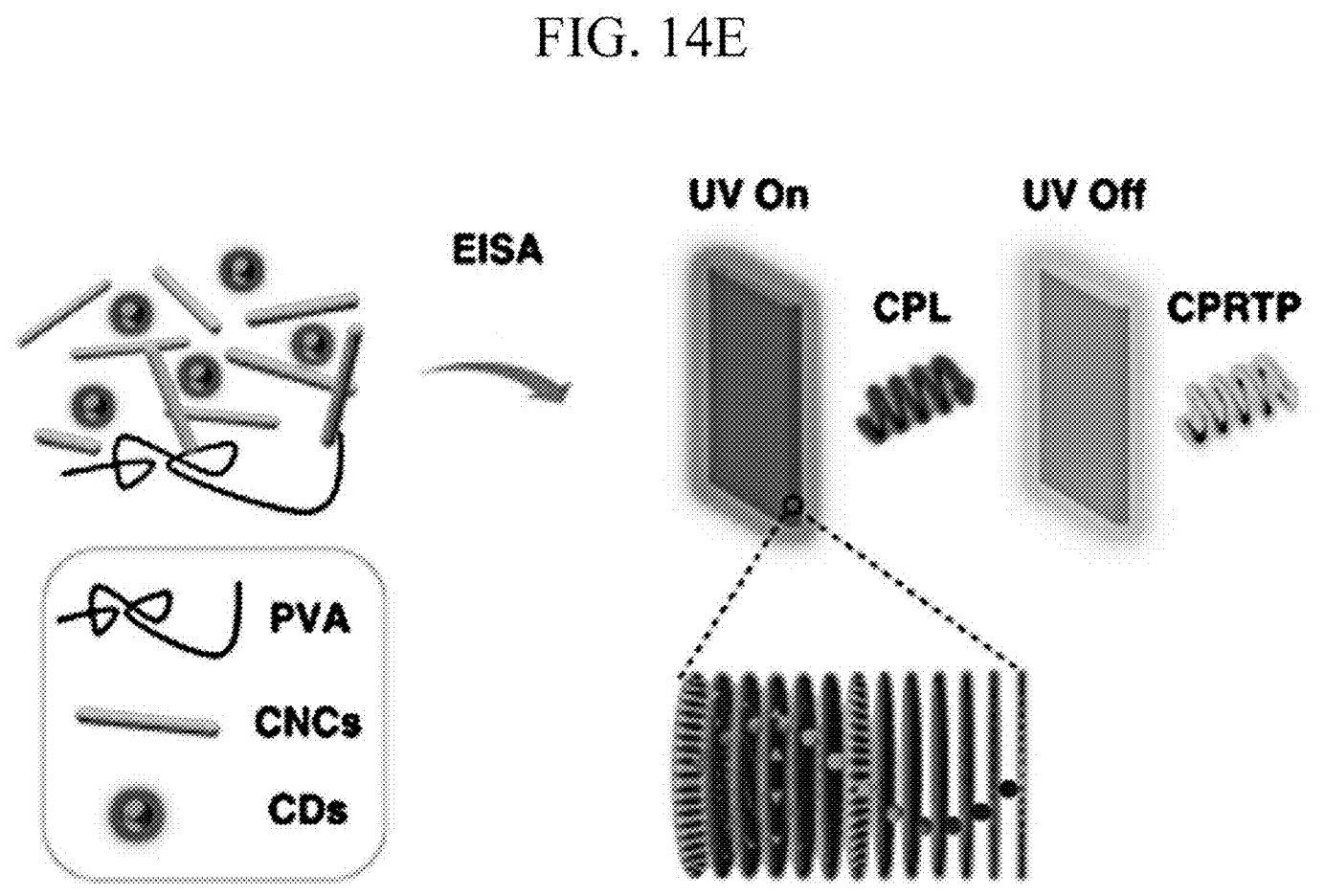

FIG. 14D shows a method in which circular polarization is generated while allowing light to pass through a material formed to be stacked with a plurality of layers having a predetermined pitch, and FIG. 14E shows a method that emits circularly polarized (CPL) light by using ultraviolet rays ("UV") by combining polyvinyl alcohol (PVA), cellulose nanocrystals ("CNC"), and carbon dots ("CD").

The methods shown in FIGS. 14A to 14E are examples of various methods, and the present invention is not limited thereto.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

100, 100_1: display panel 110: absorptive polarizer
120: reflective polarizer 130: retarder
200: optical system 210: first curved lens
211: first retarder 212: beam splitter
220: second curved lens 221: second retarder
222: reflective polarizer 230: curved lens
231: retarder 232: reflective polarizer
300: eye 150, 150_1: light emitting element part
Cathode: cathode LCP: left-circularly polarized
RCP: right-circularly polarized SUB: substrate
TFT: transistor GAT: gate electrode
In1: first inorganic insulating layer
In2: second inorganic insulation layer
In3: first organic insulating layer EL: intermediate layer
PDL: pixel defining layer Anode: anode
OLED: organic light emitting element
encap1: encapsulation substrate
encap2: encapsulation layer
encap2-1: first encapsulation inorganic layer
encap2-2: encapsulation organic layer
encap2-3: second encapsulation inorganic layer

What is claimed is:

1. A head mount display device, comprising:
a display panel; and
an optical system positioned in front of the display panel,
wherein the display panel includes layers arranged in an order of a light emitting element part, a third retarder, a first reflective polarizer, an absorptive polarizer, and the third retarder is positioned between the optical system and the light emitting element part, and there is no additional polarizer between the third retarder and the first reflective polarizer and no additional polarizer between the first reflective polarizer and the absorptive polarizer; and the optical system includes:

a first curved lens, which is positioned to face the display panel, and includes a first retarder positioned on a first surface thereof facing the display panel and a beam splitter positioned on a second surface thereof opposite to the first surface; and a second curved lens, which is positioned to face the beam splitter, and includes a second retarder positioned on a first surface thereof facing the beam splitter and a second reflective polarizer positioned on a second surface thereof opposite to the first surface of the second curved lens.

2. The head mount display device of claim 1, wherein:

the first reflective polarizer of the display panel has a first reflective axis, reflects polarized light of the first reflective axis, and transmits polarized light perpendicular to the first reflective axis; and the absorptive polarizer of the display panel has an absorptive axis, absorbs polarized light of the absorptive axis, and transmits polarized light perpendicular to the absorptive axis.

3. The head mount display device of claim 2, wherein the third retarder has a first retardation axis, and retards light in a direction of the first retardation axis by $\lambda/4$ to change linearly polarized light to circularly polarized light or change circularly polarized light to linearly polarized light.

4. The head mount display device of claim 3, wherein the absorptive axis and the first reflective axis have a same direction.

5. The head mount display device of claim 4, wherein the second reflective polarizer of the second curved lens has a second reflective axis, reflects polarized light of the second reflective axis, and transmits polarized light perpendicular to the second reflective axis.

6. The head mount display device of claim 5, wherein:

the first retarder of the first curved lens has a second retardation axis, and retards light in a direction of the second retardation axis by $\lambda/4$ to change linearly polarized light to circularly polarized light or change circularly polarized light to linearly polarized light; and the second retarder of the second curved lens has a third retardation axis, and retards light in a direction of the third retardation axis by $\lambda/4$ to change linearly polarized light to circularly polarized light or change circularly polarized light to linearly polarized light.

7. The head mount display device of claim 6, wherein the second reflective axis has a same angle as each of the absorptive axis and the first reflective axis.

8. The head mount display device of claim 7, wherein the first reflective axis, the second retardation axis, and the third retardation axis have an angle of 45 degrees to the absorptive axis and the first reflective axis.

9. The head mount display device of claim 7, wherein at least one of the third retarder of the display panel, the first retarder of the first curved lens, and the second retarder of the second curved lens has an inverse wavelength dispersion characteristic.

10. The head mount display device of claim 6, wherein the beam splitter of the first curved lens reflects half of incident light, and transmits the other half of the incident light.

11. The head mount display device of claim 10, wherein:

the light emitting element part includes an anode, an intermediate layer including a light emitting layer, and a cathode; and the cathode reflects half of light incident from a front surface thereof.

12. The head mount display device of claim 11, wherein:

the display panel further includes an encapsulation substrate, which blocks moisture or air from flowing into the light emitting layer; and the encapsulation substrate is positioned at an upper portion of the cathode.

13. The head mount display device of claim 12, wherein the encapsulation substrate is in contact with at least one of the third retarder, the first reflective polarizer, and the absorptive polarizer.

14. The head mount display device of claim 11, wherein:

the display panel further includes an encapsulation layer, which blocks moisture or air from flowing into the light emitting layer;

the encapsulation layer includes a first encapsulation inorganic layer and a second encapsulation inorganic layer, which are two inorganic encapsulation layers, and an encapsulation organic layer, which is one organic encapsulation layer; and the first encapsulation inorganic layer, the encapsulation organic layer, the second encapsulation inorganic layer are sequentially stacked.

15. A head mount display device, comprising:

a display panel; and an optical system positioned in front of the display panel, wherein the display panel includes a light emitting element part, which emits circularly polarized light, and the optical system consists of one curved lens, a retarder positioned directly on a first surface of the curved lens facing the display panel, and a reflective polarizer positioned directly on a second surface of the curved lens opposite to the first surface.

16. The head mount display device of claim 15, wherein a separate optical film is not positioned between the light emitting element part of the display panel and the optical system.

17. The head mount display device of claim 15, wherein the retarder has a retardation axis, and retards light in a direction of the retardation axis by $\lambda/4$ to change linearly polarized light to circularly polarized light or change circularly polarized light to linearly polarized light.

18. The head mount display device of claim 17, wherein the reflective polarizer reflects polarized light of a reflective axis, and transmits polarized light perpendicular to the reflective axis.

19. The head mount display device of claim 18, wherein the retardation axis and the reflective axis form an angle of 45 degrees.

20. The head mount display device of claim 15, wherein a light emitting layer of a light emitting diode included in the light emitting element part includes a material of a chiral luminophore or a material of a helix structure, or emits circularly polarized light through a birefringence method.

\* \* \* \* \*